(12) United States Patent
Oikawa

(10) Patent No.: US 12,009,309 B2
(45) Date of Patent: Jun. 11, 2024

(54) SEMICONDUCTOR DEVICE HAVING A PLURALITY OF SEMICONDUCTOR LAYERS COVERING AN EMISSION LAYER

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 402 days.

(21) Appl. No.: 17/517,955

(22) Filed: Nov. 3, 2021

(65) Prior Publication Data
US 2022/0165672 A1 May 26, 2022

(30) Foreign Application Priority Data

Nov. 20, 2020 (JP) .................................. 2020-193096

(51) Int. Cl.
*H04B 10/40* (2013.01)
*H01L 23/538* (2006.01)
*H01L 25/065* (2023.01)
*H04B 10/50* (2013.01)

(52) U.S. Cl.
CPC ...... *H01L 23/5386* (2013.01); *H01L 23/5385* (2013.01); *H01L 25/0657* (2013.01); *H04B 10/40* (2013.01); *H04B 10/503* (2013.01)

(58) Field of Classification Search
CPC .............................. H04B 10/40; H04B 10/503
USPC ........................................................... 257/10
See application file for complete search history.

(56) References Cited

U.S. PATENT DOCUMENTS

| 9,245,911 | B2 | 1/2016 | Minagawa |
| 10,809,470 | B2 | 10/2020 | Tsuchiyama et al. |
| 10,886,695 | B2 | 1/2021 | Tsuchiyama et al. |
| 2019/0052365 | A1* | 2/2019 | Joseph ................ H01S 5/18388 |

FOREIGN PATENT DOCUMENTS

| JP | 2015-153955 A | 8/2015 |
| JP | 2019-212837 A | 12/2019 |
| JP | 2020-043251 A | 3/2020 |

* cited by examiner

*Primary Examiner* — Hoai V Pham
(74) *Attorney, Agent, or Firm* — Rimon P.C.

(57) ABSTRACT

A first semiconductor element (laser diode) and a second semiconductor element (laser diode) are connected to each other in series between a wiring electrically connected to an anode of the first semiconductor element and a wiring electrically connected to a cathode of the second semiconductor element. In this case, each of the first semiconductor element and the second semiconductor element includes a laminated pattern having an emission layer and a plurality of semiconductor layers covering this laminated pattern.

17 Claims, 19 Drawing Sheets

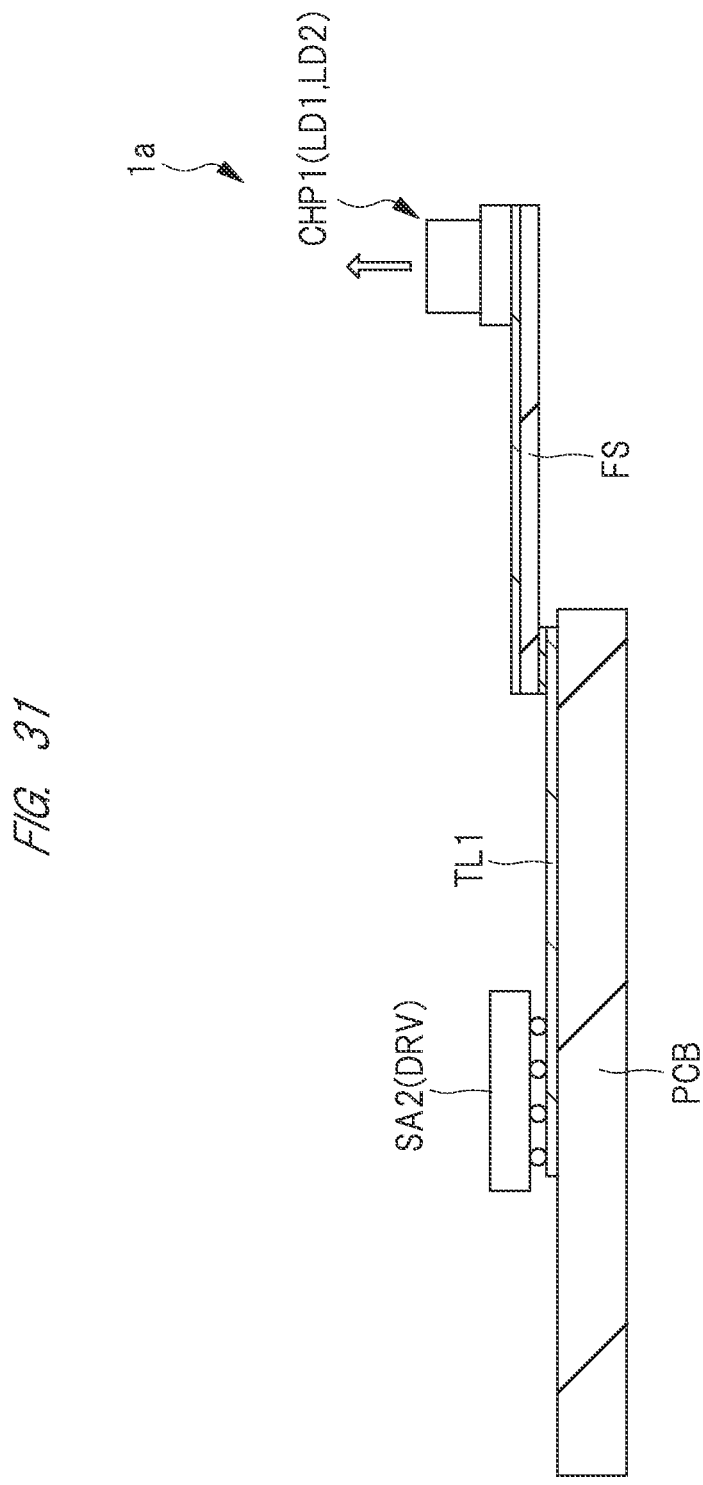

SEMICONDUCTOR DEVICE HAVING A PLURALITY OF SEMICONDUCTOR LAYERS COVERING AN EMISSION LAYER

CROSS-REFERENCE TO RELATED APPLICATIONS

The disclosure of Japanese Patent Application No. 2020-193096 filed on Nov. 20, 2020 including the specification, drawings and abstract is incorporated herein by reference in its entirety.

BACKGROUND

The present invention relates to a semiconductor device and an electronic device, and more particularly, the present invention relates to, for example, an effective technique to be applied to a semiconductor device and an electronic device that include a laser diode.

Patent Document 1 (Japanese Unexamined Patent Application Publication No. 2019-212837) and Patent Document 2 (Japanese Unexamined Patent Application Publication No. 2020-43251) disclose a small optical device for transmission (TOSA: Transmitter optical sub assembly) to be used in an optical transceiver.

Further, Patent Document 3 (Japanese Unexamined Patent Application Publication No. 2015-153955) discloses a plurality of photovoltaic diodes connected to each other in series.

There are disclosed techniques listed below.
[Patent Document 1] Japanese Unexamined Patent Application Publication No. 2019-212837
[Patent Document 2] Japanese Unexamined Patent Application Publication No. 2020-43251
[Patent Document 3] Japanese Unexamined Patent Application Publication No. 2015-153955

SUMMARY

For example, in a small optical device for transmission to be used in an optical transceiver, as Nyquist frequency of a signal increases, deterioration of a signal quality caused by multiple reflection due to mismatch between a characteristic impedance of a laser diode and a characteristic impedance of a transmission line becomes apparent. For this reason, from the viewpoint of improving the signal quality, it is desired to match the characteristic impedance of the laser diode with the characteristic impedance of the transmission line.

The other object and new feature will become apparent from description of the present specification and the accompanying drawings.

In a semiconductor device according to one embodiment, a first semiconductor element (for example, a laser diode) formed on a semiconductor substrate and a second semiconductor element (for example, a laser diode) formed on the semiconductor substrate are connected to each other in series between a first wiring electrically connected to an anode of the first semiconductor element and a second wiring electrically connected to a cathode of the second semiconductor element. Here, each of the first semiconductor element and the second semiconductor element includes a laminated pattern having an emission layer and a plurality of semiconductor layers covering this laminated pattern.

Further, in a semiconductor device according to another embodiment, a first semiconductor element (for example, a laser diode) formed on a first semiconductor substrate of a first semiconductor chip and a second semiconductor element (for example, a laser diode) formed on a second semiconductor substrate of a second semiconductor chip are connected to each other in series between a first wiring electrically connected to an anode of the first semiconductor element and a second wiring electrically connected to a cathode of the second semiconductor element. Here, each of the first semiconductor element and the second semiconductor element includes a laminated pattern having an emission layer and a plurality of semiconductor layers covering this laminated pattern.

Moreover, an electronic device according to still another embodiment includes: a stem; a dielectric substrate formed on the stem, the dielectric substrate having a first wiring and a second wiring arranged along the first wiring; a first semiconductor chip mounted on the dielectric substrate, the first semiconductor chip having a semiconductor substrate, a first semiconductor element (for example, a laser diode) formed on the semiconductor substrate, and a second semiconductor element (for example, a laser diode) formed on the semiconductor substrate, an anode of the first semiconductor element being electrically connected to the first wiring, and a cathode of the second semiconductor element being electrically connected to the second wiring; a mounting substrate coupled to the dielectric substrate via a flexible substrate; and a second semiconductor chip mounted on the mounting substrate. Here, the first semiconductor element and the second semiconductor element are connected to each other in series between the first wiring and the second wiring. Further, each of the first semiconductor element and the second semiconductor element includes a laminated pattern having an emission layer and a plurality of semiconductor layers covering this laminated pattern.

According to one embodiment, it is possible to improve performance of a semiconductor device.

Further, according to another embodiment, it is also possible to improve performance of a semiconductor device.

Moreover, according to still another embodiment, it is possible to improve performance of an electronic device.

BRIEF DESCRIPTION OF THE DRAWINGS

FIG. 31 is a view illustrating a schematic mounting configuration of a transmission unit of an optical transceiver that is the electronic device according to the third embodiment.

DETAILED DESCRIPTION

Figure 1:
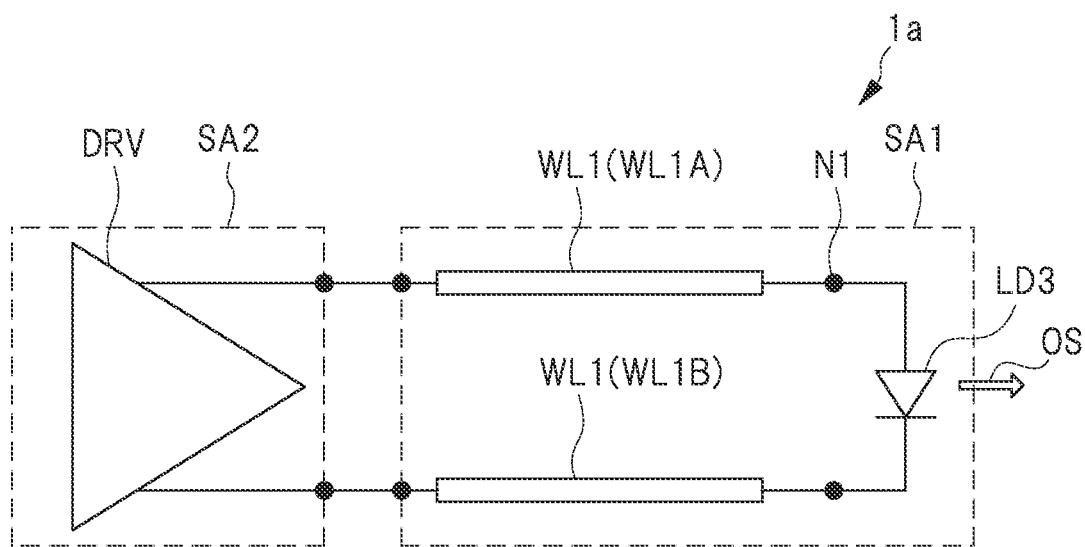
FIG. 1 is an equivalent circuit diagram illustrating a schematic configuration of an optical transceiver according to a first related technique.

In embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Further, in the embodiments described below, in a case of referring to the number of elements (including number of pieces, values, amount, range, and the like), the number of the elements is not limited to a specific number unless otherwise stated or except the case where the number is apparently limited to a specific number in principle, and the number larger or smaller than the specified number may also be applicable.

Moreover, in the embodiments described below, it goes without saying that the components (including element steps and the like) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, in all of the drawings for explaining the embodiments, in principle, the same reference numeral is assigned to the same member, and repeated explanation thereof will be omitted. Note that hatching may be applied to even a plan view in order to cause the drawings to be understood easily.

First Embodiment

In a first embodiment, an electronic device composed of an optical transceiver will be described. The optical transceiver is an electronic device that has a function to convert an electrical signal into an optical signal and transmit the optical signal, and a function to receive an optical signal and convert the optical signal into an electrical signal.

<Consideration for Improvement>

First, before explaining an optical transceiver according to the first embodiment, the room for improvement that exists in a transceiver according to a first related technique and a second related technique will be described.

Here, the "related technique" mentioned in the present specification is a technique having a problem newly found by the inventor(s), and is not known conventional technique, but is a technique described with the intention of a premised technology (unknown technology) of a new technical idea.

FIG. 1 is an equivalent circuit diagram illustrating a schematic configuration of an optical transceiver according to a first related technique. As illustrated in FIG. 1, the optical transceiver according to the first related technique includes a transmission unit 1a.

The transmission unit 1a includes a semiconductor device SA1 and a semiconductor device SA2. The semiconductor device SA1 includes two wirings WL1 constituting a transmission line and a semiconductor element (laser diode) LD3 electrically connected between these wirings WL1. The semiconductor device SA2 includes a driving circuit DRV for driving the semiconductor element LD3. As a result, the semiconductor element LD3 included in the semiconductor device SA1 is controlled by the driving circuit DRV included in the semiconductor device SA2. Namely, the driving circuit DRV is configured to directly modulate the semiconductor element LD3 on the basis of an electrical signal, whereby an optical signal directly modulated on the basis of the electrical signal is outputted from the semiconductor element LD3. Each of the wirings WL1 is connected to the semiconductor element LD3 via a node N1. FIG. 1 illustrates an optical signal OS outputted from the semiconductor element LD3 by a white arrow.

In other words, the semiconductor element LD3 is a direct modulation type laser diode. The direct modulation type laser diode modulates an amount of current to be applied to a semiconductor element to modulate intensity of output light. On the other hand, there is an indirect modulation type in which a light absorbing element is integrated with a semiconductor element and an amount of light absorption is modulated to modulate intensity of output light. The transmission unit 1a of the optical transceiver is configured in this manner.

The optical signal outputted from the semiconductor element LD3 is inputted into a photodiode that composes a reception unit (not illustrated in the drawings). As a result, the optical signal is subjected to photoelectric conversion in the photodiode to generate a current signal. This current signal is inputted into an amplifier, and is converted into a voltage signal. Optical communication between the semiconductor element LD3 and the photodiode is performed via an optical fiber OF (which will be described later with reference to FIG. 4). The optical fiber OF is connected to the semiconductor device SA1 by being fitted in an optical fiber connector OFC, which is a hole provided at a tip of the semiconductor device SA1 in a Y direction. A small optical device for transmission (TOSA) composed of the driving circuit DRV (that is, a laser driver), the semiconductor element LD3 (that is, a laser diode), and the optical fiber connector OFC is a device that has a function to convert an electrical signal into an optical signal and transmit the optical signal to an optical fiber.

In a case where the semiconductor element LD3 is considered as a single element, the smaller a parasitic resistance thereof is, the more effectively a current is converted into light. For this reason, an input resistance of a direct modulation type semiconductor element is set to a low value. A differential impedance of the semiconductor element LD3 is about 10Ω, for example. On the other hand, it is difficult to manufacture a transmission line having an extremely low impedance, and large current noise is induced for very small external voltage noise. Since the direct modulation type semiconductor element is a device that modulates an amount of current, such current noise lowers a S/N ratio (signal/noise ratio). Therefore, for example, a transmission line with a differential impedance of 50Ω is selected. Note that in a case where a transmission unit is used as a single end, a transmission line with a differential impedance of 25Ω is selected. Namely, a single end impedance of one wiring WL1 is about 25Ω, for example, and a total differential impedance of the two wirings WL1 provided on the left side of the node N1 illustrated in FIG. 1 is about 50Ω, for example.

In the small optical device for transmission using the direct modulation type laser diode, a differential impedance mismatch occurs between the transmission line and the semiconductor element LD3 with the node N1 as a boundary. This causes a part of the electrical signal flowing through the wiring WL1 to be reflected before inputting into the semiconductor element LD3.

As a result, quality of the electrical signal deteriorates due to the mismatch of the differential impedances (deterioration of a waveform of the electrical signal). Namely, the S/N ratio of the electrical signal becomes small. In other words, the S/N ratio of the electrical signal deteriorates. This leads to a decrease in performance of the optical transceiver.

In a case where a modulation signal is relatively low, for example, 10 Gbps, signal reflection due to impedance mismatch is not fatal. However, in a case where a signal modulation speed is as high as 50 to 100 Gbps, for example, or in a case where a multi-vale modulation system, which is weak against signal reflection, is used, signal reflection due to impedance mismatch and deterioration of an S/N ratio becomes problems.

A main cause of the mismatch of the differential impedances described above is that the differential impedance of the semiconductor element LD3 is significantly lower than the differential impedance of the wiring WL1.

Figure 2:
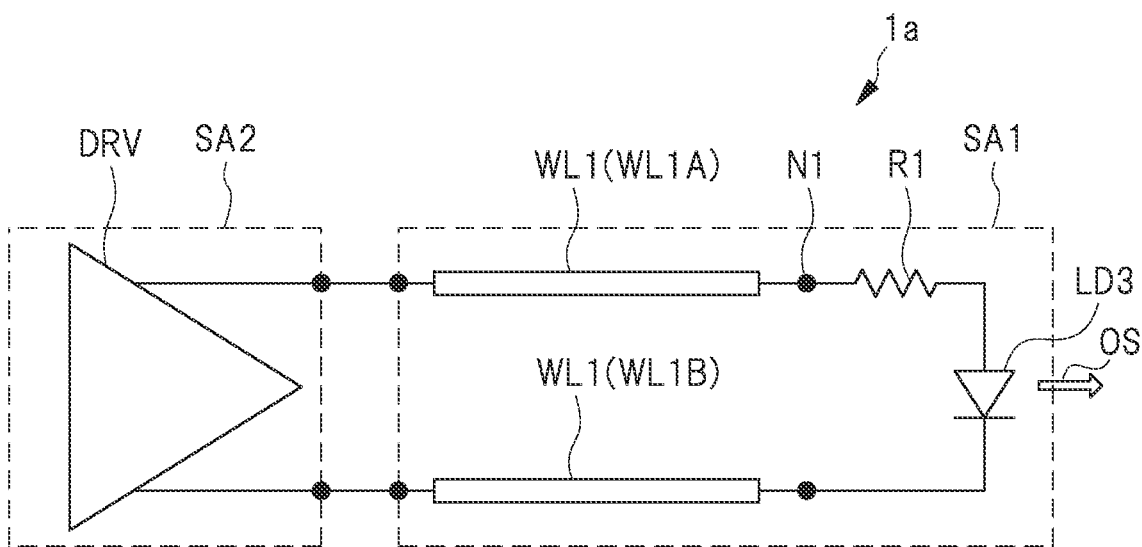
FIG. 2 is an equivalent circuit diagram illustrating a schematic configuration of an optical transceiver according to a second related technique.

Therefore, as explained with reference to FIG. 2, it is conceivable to add a resistance in series to use a so-called terminating resistor. FIG. 2 is a block diagram illustrating a schematic configuration of an optical transceiver according to the second related technique. As illustrated in FIG. 2, the optical transceiver according to the second related technique is configured so that a terminating resistor R1 is connected in series between one wiring WL1 and a semiconductor element LD3. By using the terminating resistor R1 in this manner, it is possible to suppress the signal reflection in portions illustrated in FIG. 2 by broken lines, that is, between the wirings WL1 and the semiconductor element LD3. In this structure, since the signal reflection may be reduced, a resistance value of the terminating resistor R1 is not necessarily set to 40Ω, which is a difference between 50Ω and 10Ω. For example, even in a case where the resistance value of the terminating resistor R1 is about 10Ω, the optical transceiver works effectively.

Here, the terminating resistor R1 has a problem that a main signal is also attenuated in addition to a reflected signal (the signal is converted into heat).

For example, if both an input resistance of the semiconductor element LD3 and the terminating resistor R1 are 10Ω, half of signal energy supplied from the driving circuit DRV is lost as heat. In other words, energy incident on the semiconductor element LD3 is halved. For this reason, an output of a light output signal is lowered, and the S/N ratio of the signal is deteriorated as well as a case where the signal reflection is large. Therefore, compared with the first related technique, the S/N ratio of the optical signal generated from the semiconductor element LD3 according to the second related technique is not so improved. Further, if the absolute value of amplitude of the modulation signal is small, long-distance transmission becomes difficult due to attenuation in the optical fiber.

As described above, in the optical transceiver in which the semiconductor element LD3 is directly modulated, the impedance mismatch between the transmission line and the semiconductor element exists as the room for improvement. Further, there is room for improvement that in a case where a terminating resistor is provided, the signal energy is converted into heat by the terminating resistor, whereby the S/N ratio is deteriorated.

Therefore, in the first embodiment, the room for improvement is devised. Hereinafter, the devised technical idea according to the present embodiment will be described.

<Configuration of Electronic Device (Optical Transceiver) According to First Embodiment>

Figure 3:
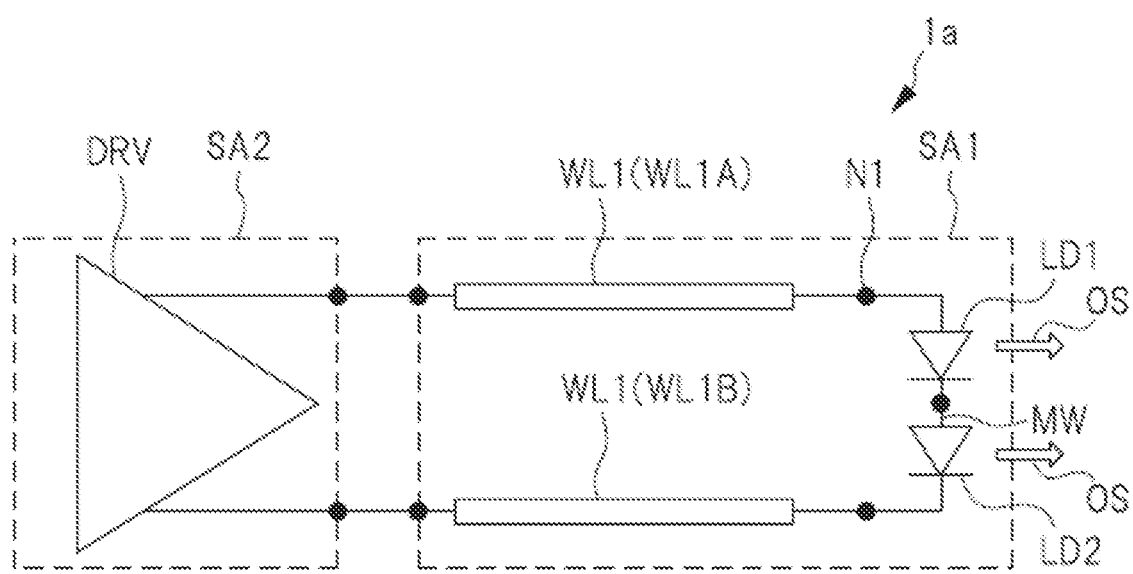
FIG. 3 is an equivalent circuit diagram illustrating a schematic configuration of an optical transceiver according to a first embodiment.

FIG. 3 is a block diagram illustrating a schematic configuration of an optical transceiver according to the first embodiment. As illustrated in FIG. 3, the optical transceiver according to the first embodiment includes a transmission unit 1a and a reception unit (not illustrated in the drawings).

The transmission unit 1a has semiconductor devices SA1 and SA2. The semiconductor device SA1 includes wirings WL1, and semiconductor elements (laser diode) LD1, LD2, which are electrically connected to the wirings WL1. The semiconductor device SA2 includes a driving circuit DRV for driving the semiconductor elements LD1 and LD2.

Specifically, the semiconductor elements LD1 and LD2 are formed in one semiconductor chip, and the wirings WL1 and the semiconductor chip in which the semiconductor elements LD1 and LD2 are formed are embedded in the semiconductor device SA1. The semiconductor elements LD1 and LD2 are electrically connected to each other via a metallic wiring MW.

On the other hand, the driving circuit DRV is formed on another semiconductor chip, and the semiconductor chip in which the driving circuit DRV is formed is embedded in the semiconductor device SA2. In addition, in the transmission unit 1a of the optical transceiver, the semiconductor device SA1 and the semiconductor device SA2 are electrically connected to each other. As a result, the semiconductor elements LD1 and LD2 formed on a semiconductor chip CHP1, which is included in the semiconductor device SA1, are controlled by the driving circuit DRV formed on the other semiconductor chip included in the semiconductor device SA2. Namely, the driving circuit DRV is configured to directly modulate the semiconductor elements LD1 and LD2 on the basis of an electrical signal, whereby an optical signal directly modulated on the basis of the electrical signal is outputted from each of the semiconductor elements LD1 and LD2. FIG. 3 illustrates optical signals OS outputted from the semiconductor elements LD1 and LD2 as white arrows.

From the above, the optical transceiver (as the electronic device) according to the first embodiment includes the semiconductor chip on which the driving circuit DRV configured to drive the semiconductor elements LD1 and LD2 is formed, and the semiconductor device SA1 electrically connected to the semiconductor chip. Here, the semiconductor device SA1 includes wirings WL1, and a second semiconductor chip on which the semiconductor elements LD1 and LD2 respectively connected to the wirings WL1 electrically are formed. The transmission unit 1a of the optical transceiver according to the first embodiment is configured in this manner.

Although it is not illustrated in the drawings, the reception unit of the optical transceiver has a semiconductor device SA3, and a signal processing circuit. The semiconductor device SA3 includes a photodiode, a wiring connected to this photodiode, and an amplifier AMP electrically connected to the wiring. The signal processing circuit is electrically connected to this semiconductor device SA3. In the reception unit configured in this manner, when an optical signal is inputted into the photodiode, the optical signal is subjected to photoelectric conversion in the photodiode to generate a current signal. This current signal is inputted into the amplifier to be converted into a voltage signal. The reception unit of the optical transceiver is configured in this manner.

Figure 4:
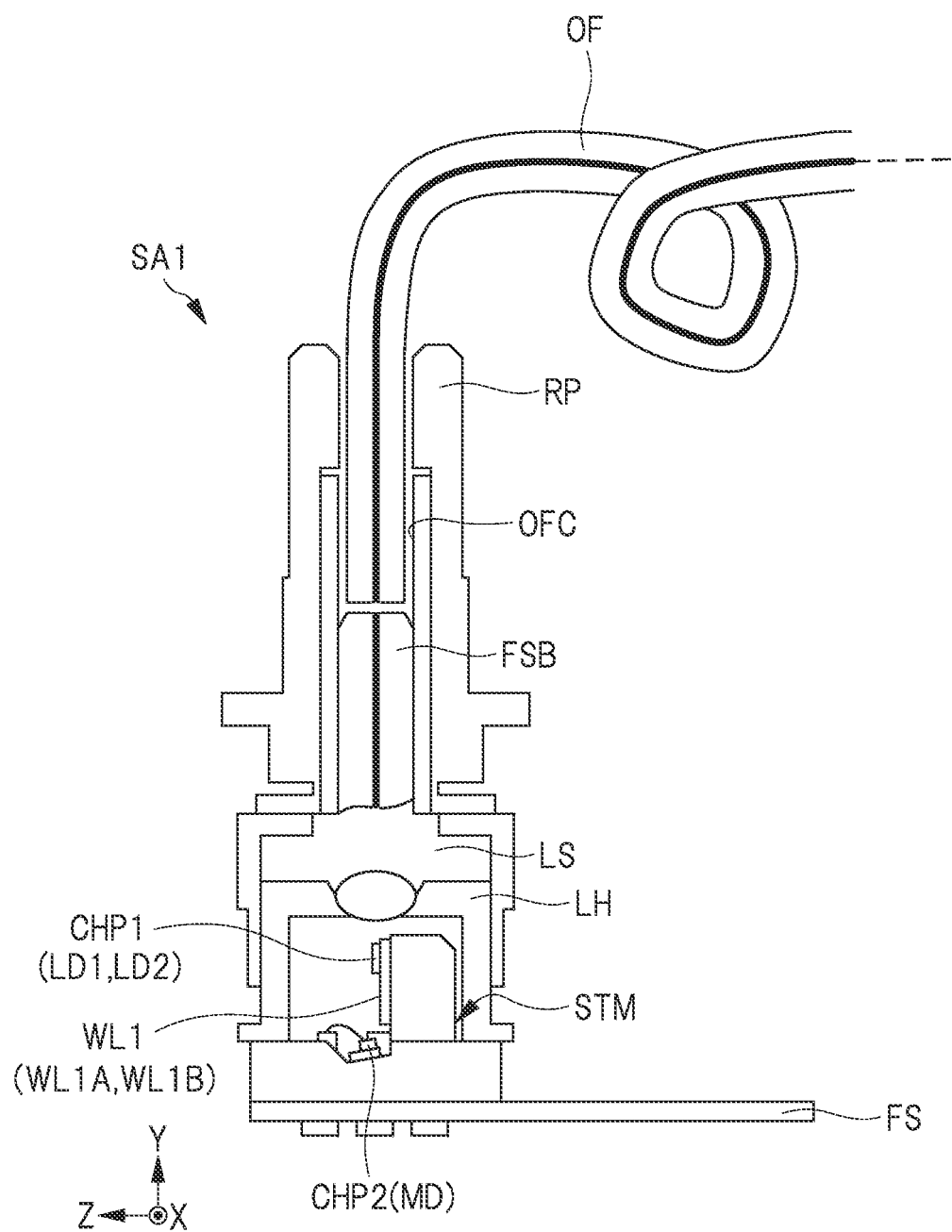
FIG. 4 is a view illustrating a schematic configuration of a semiconductor device that is a small optical device for transmission.

FIG. 4 is a view illustrating a schematic configuration of the semiconductor device SA1 that is a small optical device for transmission. As illustrated in FIG. 3 and FIG. 4, the semiconductor device SA1 is configured from a stem STM, a flexible substrate FS, and a receptacle RP. The semiconductor chip CHP1 in which the semiconductor elements LD1 and LD2 are formed and a semiconductor chip CHP2 on which a photodiode for monitor MD is formed are mounted on the stem STM. The flexible substrate FS is connected to this stem STM. A lens holder LH on which a lens LS is arranged and a fiber stub FSB are embedded in the receptacle RP. The semiconductor device SA1 configured in this manner is connected to an optical fiber OF, and is finally incorporated in an optical communication system.

A concrete structure of the stem STM and the flexible substrate FS constituting a part of the semiconductor device SA1 will be described later in a third embodiment.

Features of Present Embodiment

Figure 5:
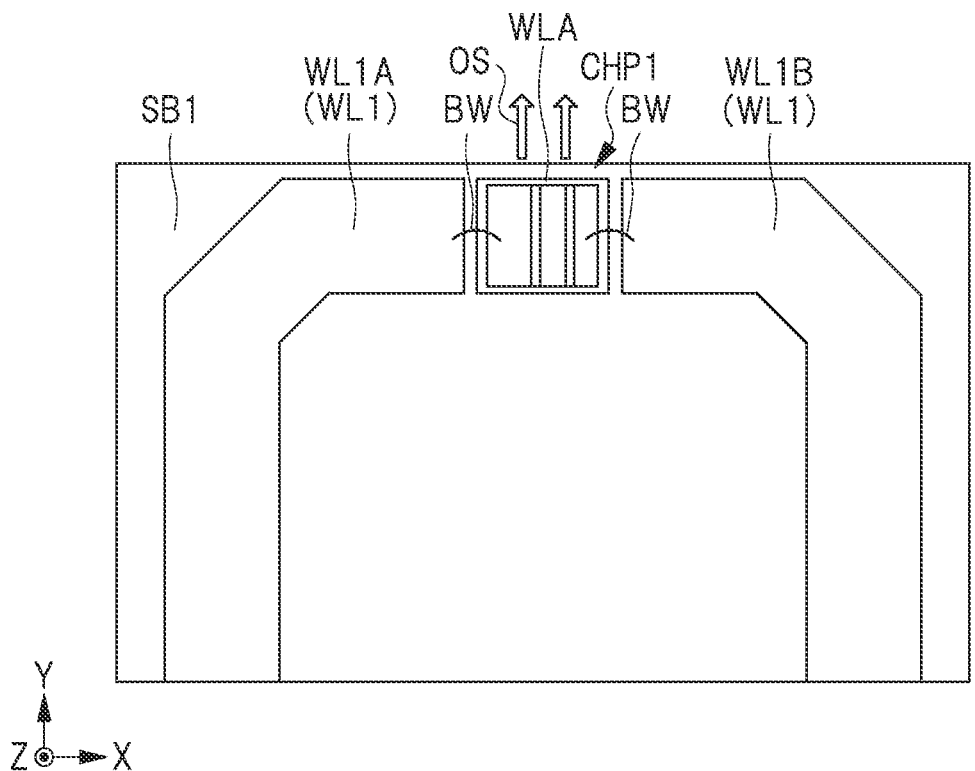
FIG. 5 is a plan view including a semiconductor chip and a wiring on a substrate according to the first embodiment.
Figure 6:
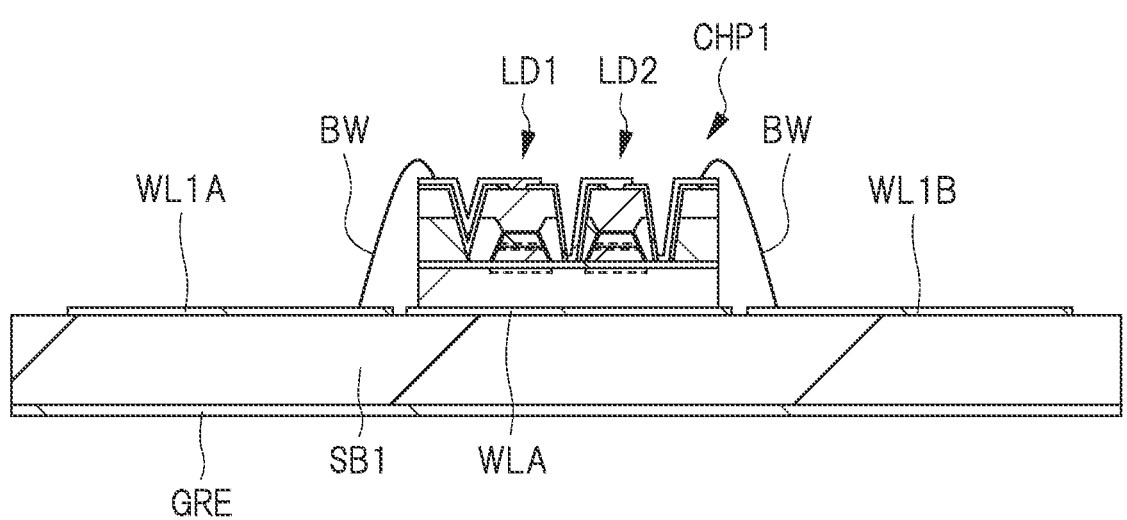
FIG. 6 is a cross-sectional view including the semiconductor chip and the wiring on the substrate according to the first embodiment.
Figure 7:
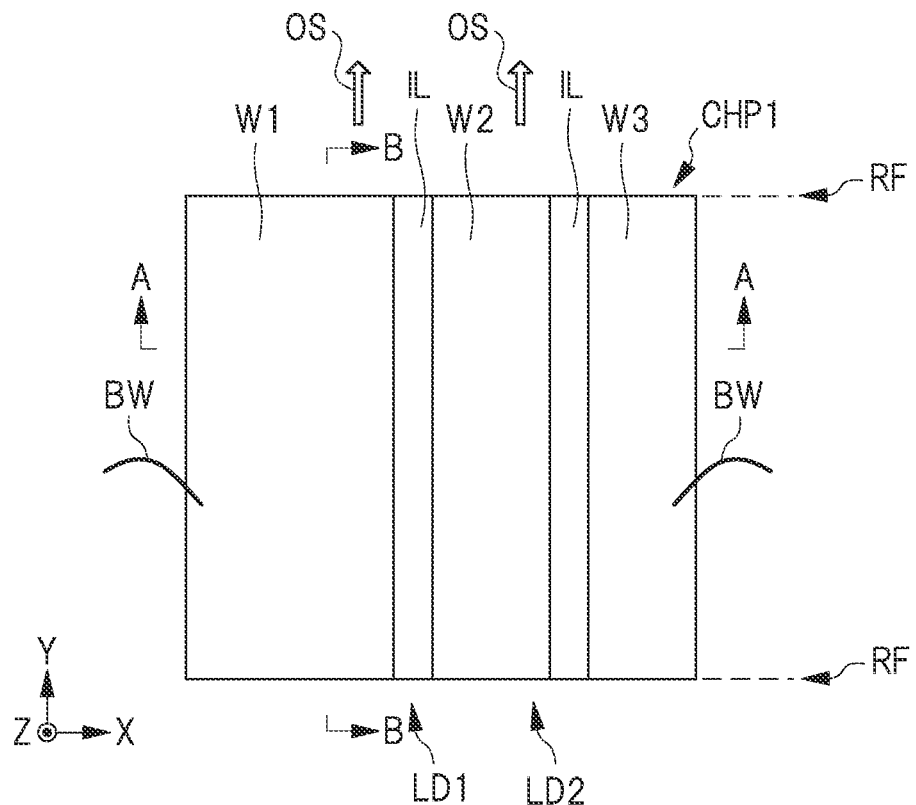
FIG. 7 is a plan view illustrating the semiconductor chip according to the first embodiment.
Figure 8:
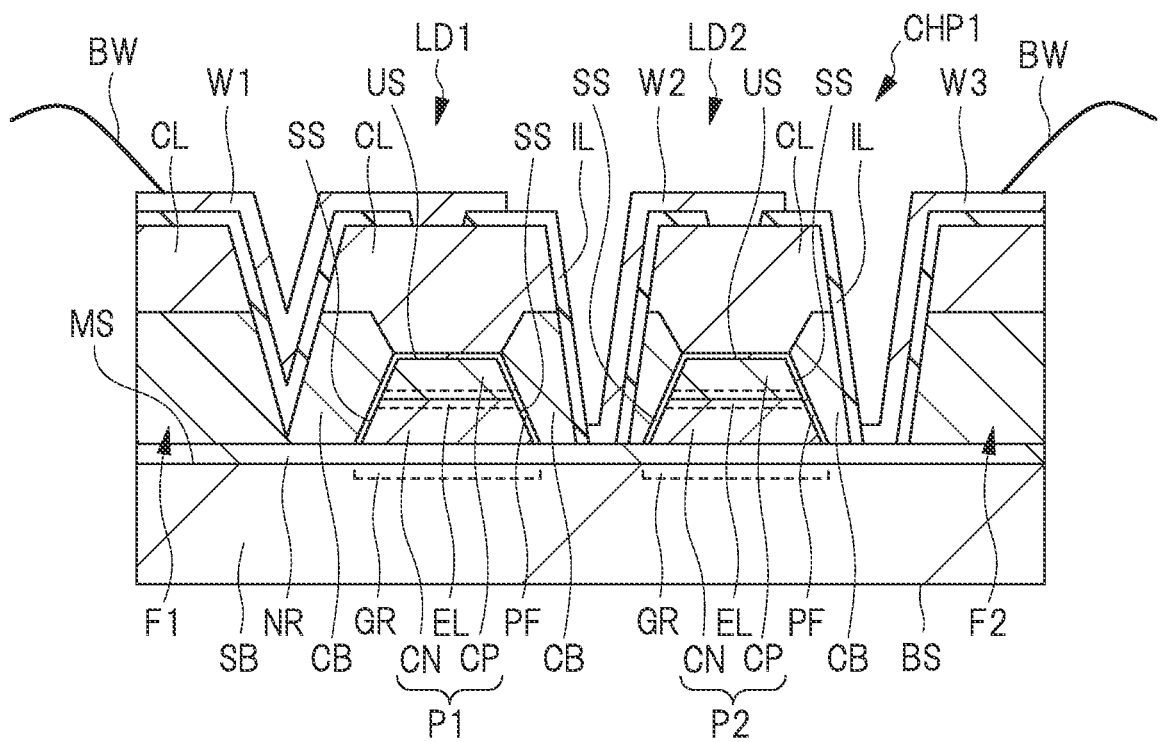
FIG. 8 is a cross-sectional view taken along a line A-A of FIG. 7.
Figure 9:
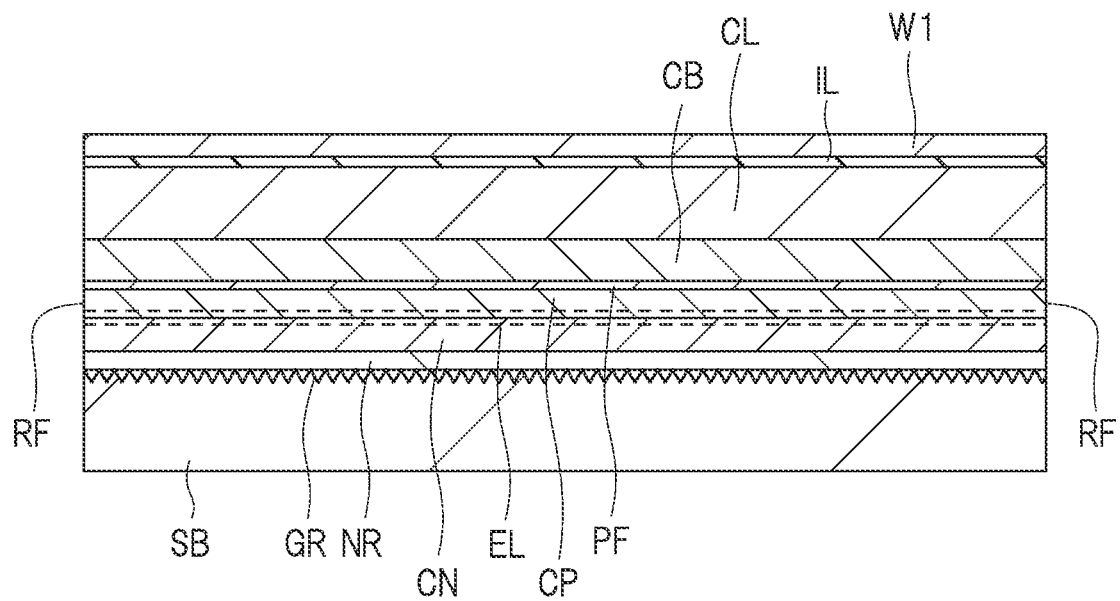
FIG. 9 is a cross-sectional view taken along a line B-B of FIG. 7.
Figure 10:
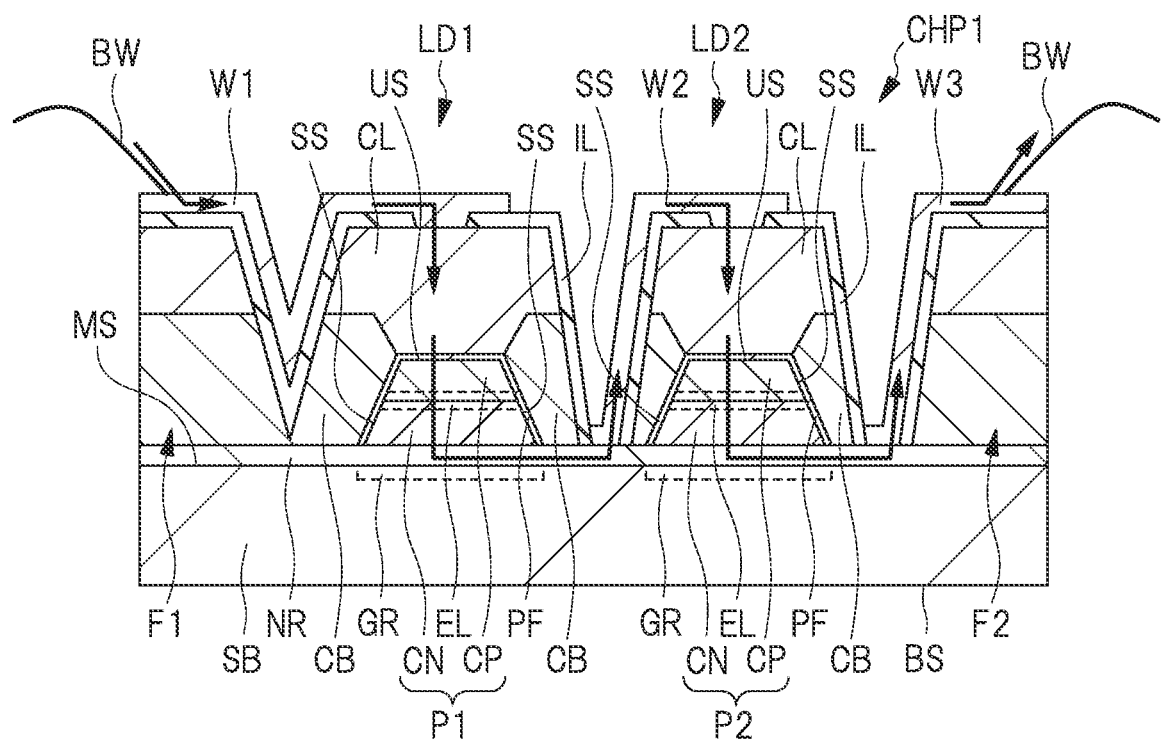
FIG. 10 is a cross-sectional view for explaining a current path of the semiconductor chip according to the first embodiment.

Hereinafter, a structure of a semiconductor device, which is a characteristic of the present embodiment, will be described with reference to FIG. 5 to FIG. 10. FIG. 5 is a plan view including a semiconductor chip, which is a semiconductor device according to the present embodiment, and a wiring on a substrate. FIG. 6 is a cross-sectional view including the semiconductor chip which is the semiconductor device according to the present embodiment, and the wiring on the substrate. FIG. 7 is a plan view illustrating the semiconductor chip, which is the semiconductor device according to the present embodiment. FIG. 8 is a cross-sectional view taken along a line A-A of FIG. 7. FIG. 9 is a cross-sectional view taken along a line B-B of FIG. 7. FIG. 10 is a cross-sectional view for explaining a current path of the semiconductor chip according to the present embodiment.

In the semiconductor device according to the present embodiment, a plurality of semiconductor elements (here, two) is connected to each other in series, and an unavoidable parasitic resistance on manufacture of the semiconductor elements are used instead of a terminating resistor. Each of the plurality of semiconductor elements serves as the terminating resistor. The added semiconductor element generates heat due to the parasitic resistance thereof, but also generates an optical signal. Therefore, by condensing additional light with a lens, waste of energy can be saved. Note that, in the present embodiment, the semiconductor element LD1 illustrated in FIG. 3 not only serves as one laser diode, but also serves as the terminating resistor R1 described in FIG. 2 (that is, a resistive element).

As illustrated in FIG. 5, a transmission substrate SB1 on which the semiconductor chip CHP1 provided with the semiconductor element is mounted is fixed to a pedestal of a metal case provided with the lens LS (see FIG. 4). Each of wirings (a signal line and a differential signal line) WL1A and WL1B, which are arranged along the Y direction on a main surface of the transmission substrate SB1, is connected to the semiconductor chip CHP1. Since the optical signal is radially outputted from an end surface of the semiconductor element, the optical signal is collected by the lens LS to be guided to a guide portion of the optical fiber. Then, the optical signal enters the optical fiber, whereby optical signal transmission is made over a long distance.

As illustrated in FIG. 6, the transmission substrate SB1 has a double-layered structure made of ceramic. A bottom surface of the transmission substrate SB1 is covered with a back surface electrode for grounding. The semiconductor chip CHP1 in which two semiconductor elements LD1 and LD2 are integrated so as to be connected in series, is mounted on the transmission substrate SB1 via a wiring WLA. Electrodes on a surface of the semiconductor chip CHP1 (an anode electrode and a cathode electrode) are respectively connected to the wiring WL1A and WL1B via bonding wires BW. In other words, the wiring WL1A is electrically connected to an anode of the semiconductor element LD1, and the wiring WL1B is electrically connected to a cathode of the semiconductor element LD2. The optical signals OS (laser beam) are generated from an end surface of the semiconductor chip CHP1, and are mainly emitted in a direction illustrated in FIG. 5 and FIG. 7 by white arrows (that is, the Y direction).

As illustrated in FIG. 7 to FIG. 9, the two semiconductor elements LD1 and LD2 are formed on the semiconductor chip CHP1. Each of the semiconductor elements LD1 and LD2 is a BH-DFB (buried-heterojunction distributed feedback) laser provided with a diffraction grating for wavelength selection, a current block layer, and a p/n junction by MQW (multiple quantum well). The current block layer is a current barrier for limiting a cross-sectional area of a current injected into the MQW to increase the current density injected into an emission region.

Specifically, the semiconductor chip CHP1 has a semiconductor substrate SB, and the semiconductor element LD1 is formed on the semiconductor substrate SB. The semiconductor substrate SB is made of InP (indium phosphide), for example. The semiconductor substrate SB has a main surface MS, and a back surface BS opposite the main surface MS. An N-type semiconductor region NR is formed on the main surface MS of the semiconductor substrate SB. The semiconductor region NR is made of InGaAsP (Indium Gallium Arsenide Phosphide), for example. An N-type semiconductor layer CN and a P-type semiconductor layer CP are laminated on the semiconductor region NR in this order. In other words, the semiconductor region NR is formed between the semiconductor substrate SB and each of the semiconductor element LD1 and the semiconductor element LD2. Further, as illustrated in FIG. 8, the semiconductor layer CN and the semiconductor layer CP are in contact with each other, and an emission layer EL is formed at a PN junction, which is a boundary surface (boundary) between the semiconductor layer CN and the semiconductor layer CP. The emission layer EL is a semiconductor layer made of AlGaInAs (Aluminum Gallium Indium Arsenide), for example. Each of the semiconductor layer CN and the semiconductor layer CP is an epitaxial growth layer (semiconductor layer) made of InP, for example.

Each of laminated patterns P1 and P2, each of which is composed of the semiconductor layer CN and the semiconductor layer CP and the emission layer EL of the boundary thereof, composes the MQW, and has a trapezoidal cross-sectional shape in a cross section along an X direction and a Z direction, for example. Namely, each of the laminated patterns P1 and P2 has the PN junction, and composes a laser diode. Side surfaces (that is, inclined surfaces) SS and an upper surface US of each of the laminated patterns P1 and P2 are continuously covered with a passivation film PF. The passivation film PF is an epitaxial growth layer made of InP, for example, that is, is made of a semiconductor rather than an insulator. The side surfaces SS on both sides in the X direction of each of the laminated patterns P1 and P2 is covered with a current block layer (semiconductor layer) CB formed via the passivation film PF. The current block layer CB is an epitaxial growth layer made of InP, for example. For example, Fe (iron) is introduced into the current block layer CB.

Note that the X direction, the Y direction, and the Z direction are directions orthogonal to each other. The main surface MS of the semiconductor substrate SB is a plane along the X direction and the Y direction.

A cladding layer (semiconductor layer) CL is formed on the semiconductor layer CP via the passivation film PF. In other words, each of the laminated patterns P1 and P2 is covered with the current block layer CB and the cladding layer CL via the passivation film PF. The cladding layer CL is formed from a top of the semiconductor layer CP and over the current block layer CB. The cladding layer CL is an epitaxial growth layer made of InP, for example. A laminated structure composed of the laminated pattern P1, the passi-vation film PF, and the current block layer CB composes the semiconductor element LD1. Further, the semiconductor element LD2 having the same structure of that of the semiconductor element LD1 is formed next to one side of the semiconductor element LD1 in the X direction. In this regard, the semiconductor element LD1 has the laminated pattern P1, while the semiconductor element LD2 has the laminated pattern P2. Thus, the semiconductor elements LD1 and LD2 are arranged side by side in the X direction on the semiconductor substrate SB, that is, on the semiconductor region NR.

A periodic structure GR is formed on the main surface MS of the semiconductor substrate SB located directly under the semiconductor layer CN of each of the semiconductor elements LD1 and LD2 so as to be in contact with the semiconductor region NR. As illustrated in FIG. 9, the periodic structure GR is a structure in which irregularities formed on the main surface MS of the semiconductor substrate SB are repeatedly arranged. These irregularities can be formed on the main surface MS of the semiconductor substrate SB by an etching method. The periodic structure GR is provided to select a wavelength of light to be resonated in the emission layer EL.

Each of the semiconductor elements LD1 and LD2 at least includes the emission layer EL that is the junction (PN junction) between the semiconductor layer CN and the semiconductor layer CP, a laser resonator, and an optical confinement structure. The laser resonator is a structure for resonating light inside each of the laminated patterns P1 and P2, and at least has reflective faces RF illustrated in FIG. 7 and FIG. 9. The reflective faces RF are end surfaces (side surfaces) of the semiconductor chip CHP1 in the Y direction. In other words, each of the laminated patterns P1 and P2 has the one reflective face RF in the Y direction, and the other reflective face RF opposite the one reflective face RF. Each of the reflective faces RF is also a cleavage surface of the semiconductor layer. Although it is not illustrated in the drawings, a thin film metal is coated on the end surfaces as the reflective faces RF. Further, it can be said that the periodic structure GR is also a part of the laser resonator. Each of the side surfaces SS at both sides of each of the laminated patterns P1 and P2 in the X direction is located between the reflective faces RF that are both sides in the Y direction.

The optical confinement structure is a structure for confining light inside each of the laminated patterns P1 and P2 by using a difference between indices of refraction of material objects. The optical confinement structure is configured by elements that sandwich the laminated patterns P1 and P2 in each of the X direction (that is, a lateral direction) and the Z direction (that is, a vertical direction). In other words, the optical confinement structure at least has the semiconductor substrate SB, the current block layer CB, and the cladding layer CL. Each of the laminated patterns P1 and P2 is sandwiched between the semiconductor substrate SB and the cladding layer CL in the Z direction. In other words, the side surfaces SS that are the both sides of each of the laminated patterns P1 and P2 in the X direction are covered with the current block layer CB. The upper surface US of each of the laminated patterns P1 and P2 is covered with the cladding layer CL. An index of refraction of each of the semiconductor substrate SB, the current block layer CB, and the cladding layer CL, which cover each of the laminated patterns P1 and P2 is smaller than an index of refraction of each of the semiconductor layers CN and CP. For this reason, light generated by the emission layer EL is reflected between any of the semiconductor substrate SB, the current block layer CB, and the cladding layer CL and any of the laminated patterns P1 and P2, and is confined and amplified inside each of the laminated patterns P1 and P2.

As described above, the semiconductor elements LD1 and LD2 are arranged side by side in the X direction. Further, a first laminated film F1 is formed in one region opposite to the semiconductor element LD2 of two regions adjacent to the semiconductor element LD1 in the X direction. The first laminated film F1 is composed of the current block layer CB and the cladding layer CL that are laminated on the semiconductor region NR in this order. Further, a second laminated film F2 is formed in one region opposite to the semiconductor element LD1 of two regions adjacent to the semiconductor element LD2 in the X direction. The second laminated film F2 is composed of the current block layer CB and the cladding layer CL that are laminated on the semiconductor region NR in this order. Surfaces (that is, side surfaces and an upper surface) of each of the first laminated film F1, the semiconductor elements LD1 and LD2, and the second laminated film F2 are covered with an insulating layer IL.

A wiring W1 made of a metallic film is formed on each of the first laminated film F1 and the semiconductor element LD1. In other words, the wiring W1 is formed on the cladding layer CL of the semiconductor element LD1 via the insulating layer IL. The wiring W1 is embedded in an opening formed in the insulating layer IL on an upper surface of the cladding layer CL constituting the semiconductor element LD1, and is electrically connected to the cladding layer CL. Further, a wiring W2 made of a metallic film is formed on the semiconductor element LD2. The wiring W2 is in contact with an upper surface of the semiconductor region NR between the semiconductor element LD1 and the semiconductor element LD2, which are provided side by side. In other words, the wiring W2 is formed on the cladding layer CL of the semiconductor element LD2 via the insulating layer IL. The wiring W2 is embedded in an opening formed in the insulating layer IL on an upper surface of the cladding layer CL constituting the semiconductor element LD2. The wiring W2 is electrically connected to the cladding layer CL. The semiconductor layer CN of the semiconductor element LD1 and the semiconductor layer CP of the semiconductor element LD2 are electrically connected to each other via the semiconductor region NR, the wiring W2, and the cladding layer CL of the semiconductor element LD2. In other words, the semiconductor elements LD1 and LD2 are connected to each other in series via the wiring W2 that is a metallic wiring. Further, a wiring W3 made of a metallic film is formed on the second laminated film F2. The wiring W3 is in contact with the upper surface of the semiconductor region NR, which is provided between the second laminated film F2 and the semiconductor element LD2. In other words, the wiring W3 is formed on the cladding layer CL of the second laminated film F2 via the insulating layer IL.

The wiring W1 is separated from the semiconductor region NR and the other wirings W2 and W3. The bonding wire BW is connected to an upper surface of the wiring W1, and the other bonding wire BW is connected to an upper surface of the wiring W2. The wiring W1 is electrically connected to the wiring WL1A (see FIG. 5) via the bonding wire BW, and the wiring W3 is electrically connected to the wiring WL1B (see FIG. 5) via the bonding wire BW.

Next, the flow of a current in the semiconductor chip will be described with reference to FIG. 10. FIG. 10 illustrates a path through which a current flows by thick arrows. An anode of the semiconductor element LD2 is electrically connected to a cathode of the semiconductor element LD1 via the semiconductor region NR and the wiring W2. Further, the wiring W1 electrically connected to the anode of the semiconductor element LD1 is electrically connected to the wiring WL1A via the bonding wire BW, and the semiconductor region NR electrically connected to the cathode of the semiconductor element LD2 is electrically connected to the wiring WL1B via the other bonding wire BW (see FIG. 5).

A current flowing from the wiring WL1A (see FIG. 5) to the wiring W1 via the bonding wire BW flows from the cladding layer CL of the semiconductor element LD1 toward the semiconductor layer CN, and then flows from the semiconductor region NR to the wiring W2. This is because a resistance value of the wiring W2 made of the metallic film is lower than that of the semiconductor region NR having impurities, the semiconductor layer CN of the semiconductor element LD2, or the like. Subsequently, the current flows from the wiring W2 toward the cladding layer CL of the semiconductor element LD1; flows toward the semiconductor layer CN of the semiconductor element LD2; and flows from the semiconductor region NR toward the wiring W3. The current then flows toward the wiring WL1B through the bonding wire BW.

In each of the semiconductor elements LD1 and LD2, the current block layer CB is provided so that a current does not flow through any path other than the laminated patterns P1 and P2 when the current flows from the cladding layer CL to the semiconductor layer CN.

A modulated optical signal is obtained by modulating the amount of current flowing in the semiconductor elements LD1 and LD2 by the driving circuit DRV. Both the semiconductor elements LD1 and LD2 have a parasitic resistance. For this reason, each of the semiconductor elements LD1 and LD2 operates as a series terminating resistor. Light emitted from the semiconductor elements LD1 and LD2 is collected by the lens LS illustrated in FIG. 4 to reach the optical fiber OF.

In the present embodiment, the two semiconductor elements LD1 and LD2 are connected to each other in series on the semiconductor substrate SB. When the current is injected into the semiconductor elements LD1 and LD2, light generated from an emission layer (or an emission region) EL of the laminated patterns P1 and P2 (the MQW) is repeatedly reflected by the end surfaces (the reflective faces RF) at both sides of each of the laminated patterns P1 and P2 in the Y direction, whereby laser oscillation occurs at a desired wavelength. The reflective face RF is a cleavage surface on which the thin film metal is coated. Note that in each of the drawings, the thin film metal is not illustrated.

Here, of the reflective faces RF at the both sides, a reflectance at one reflective face RF is set to be lower than a reflectance at the other reflective face RF. Such a difference of the reflectances can be provided by using a material having a lower reflectance than that of the thin film metal covering the other reflective face RF for the thin film metal covering the one reflective face RF. Further, such a difference of the reflectances can also be provided by not coating a thin film metal on the one reflective face RF. By lowering the reflectance of any of the reflective faces RF at the both sides, it is possible to extract laser beam from the one reflective face RF. A region called the cladding layer CL having lower dielectric constant (index of refraction) than that of the emission layer is required for the purpose of confining the laser beam even in a direction perpendicular to the main surface MS of the semiconductor substrate SB.

Further, since a compound semiconductor containing Al (aluminum), which is easily oxidized standardly at an infrared wavelength, is used, the passivation film PF and the insulating layer IL for preventing oxidation are formed here.

<Effects of Present Embodiment>

In the present embodiment, a terminating resistor as described in the second related technique is not provided, but instead, two semiconductor elements are connected to each other in series. Since the semiconductor element additionally provided as compared with the first related technique has the parasitic resistance in this manner, it is possible to eliminate the mismatch of the differential impedance by using the two semiconductor elements connected in series as well as the case where the terminating resistor is provided. In other words, since the parasitic resistance of the plurality of semiconductor elements acts as the series terminating resistor, the signal reflection is suppressed and the high-speed signal waveform is improved. At this time, energy reduction also occurs due to the parasitic resistance of the semiconductor elements additionally provided. However, by using the semiconductor elements instead of providing a resistor as a terminating resistor, it is possible to suppress generation of heat and increase the number optical signals. In other words, compared with the second related technique, since presence of the plurality of semiconductor elements increases the number of optical signals, it is possible to reduce energy waste, and this makes it possible to improve the S/N ratio.

As described above, the series termination is made by the parasitic resistance included in each of the two semiconductor elements, and the optical signals are extracted from the substantial terminating resistor. Therefore, compared with the case where a mere terminating resistor is used as the second related technique, the energy of the signals is not wasted, and this makes it possible to improve the S/N ratio. Therefore, it is possible to improve the performance of the semiconductor device provided with the optical transceiver.

Modification Example

Figure 11:
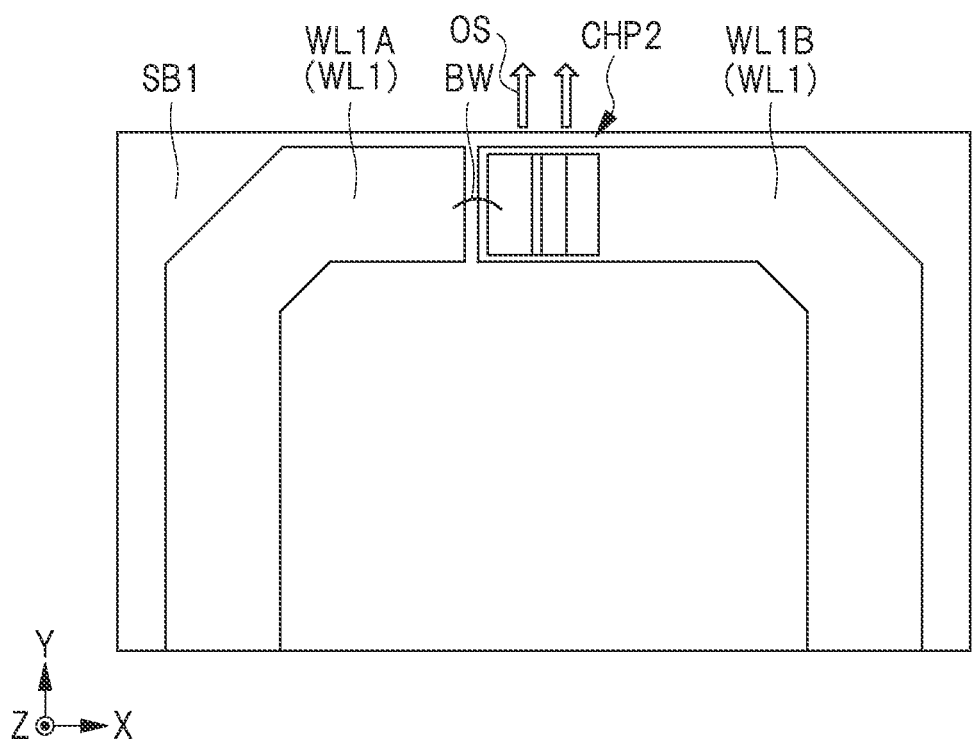
FIG. 11 is a plan view including a semiconductor chip and a wiring on a substrate according to a modification example of the first embodiment.
Figure 12:
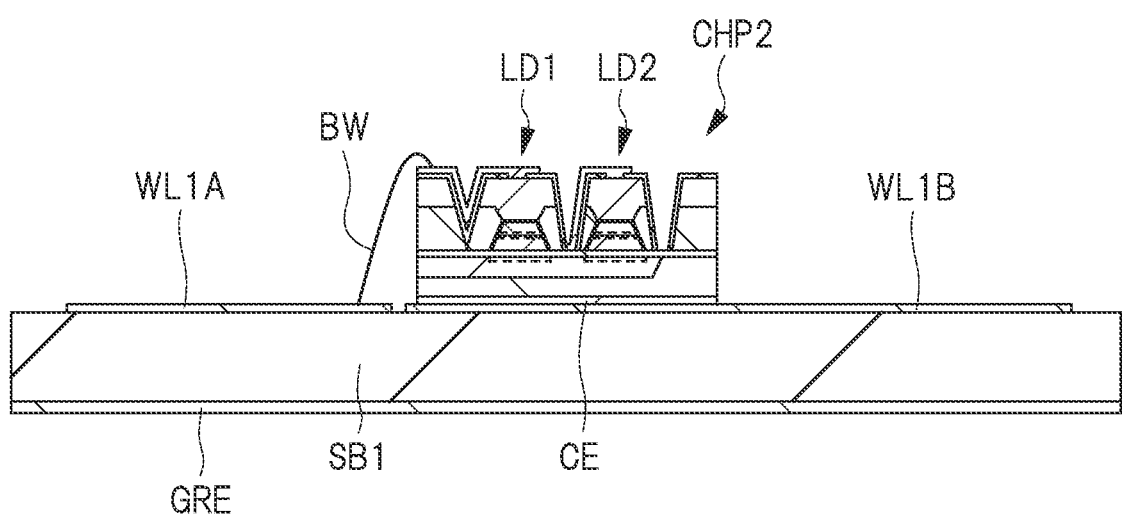
FIG. 12 is a cross-sectional view including the semiconductor chip and the wiring on the substrate according to the modification example of the first embodiment.
Figure 13:
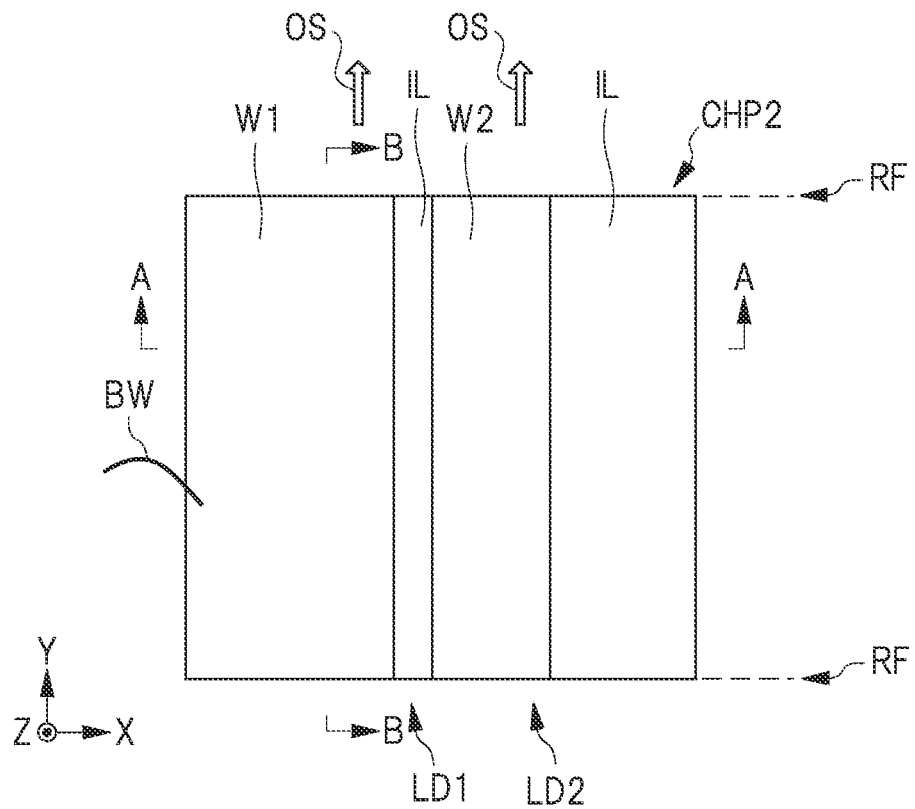
FIG. 13 is a plan view illustrating the semiconductor chip according to the modification example of the first embodiment.
Figure 14:
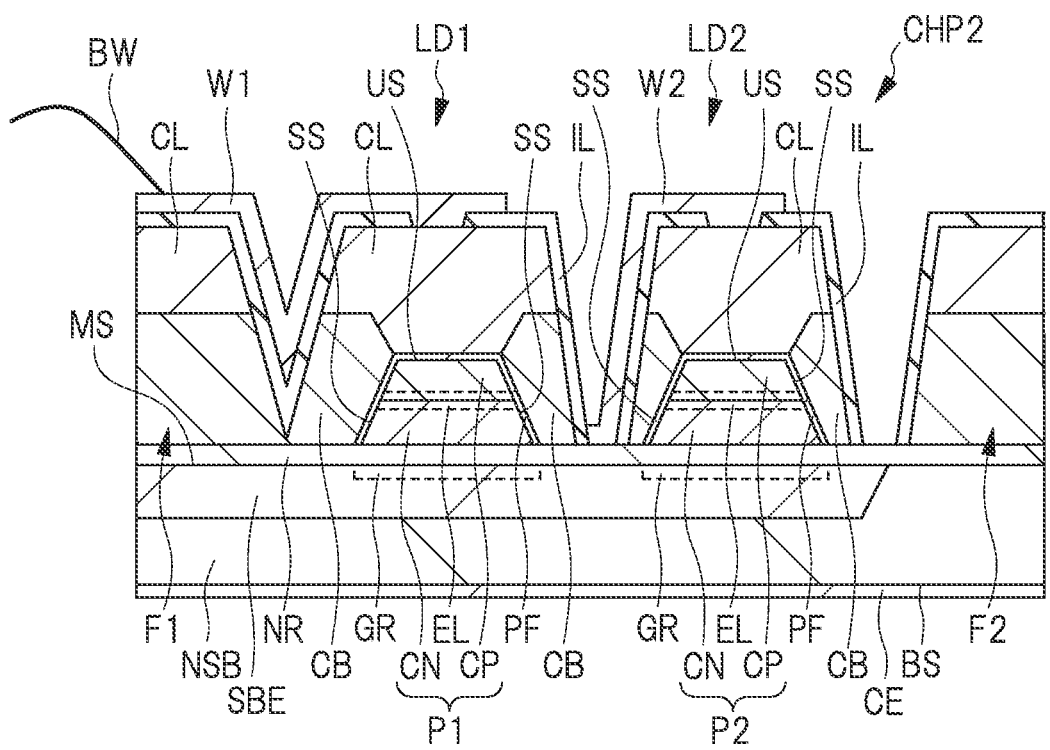
FIG. 14 is a cross-sectional view taken along a line A-A of FIG. 13.
Figure 15:
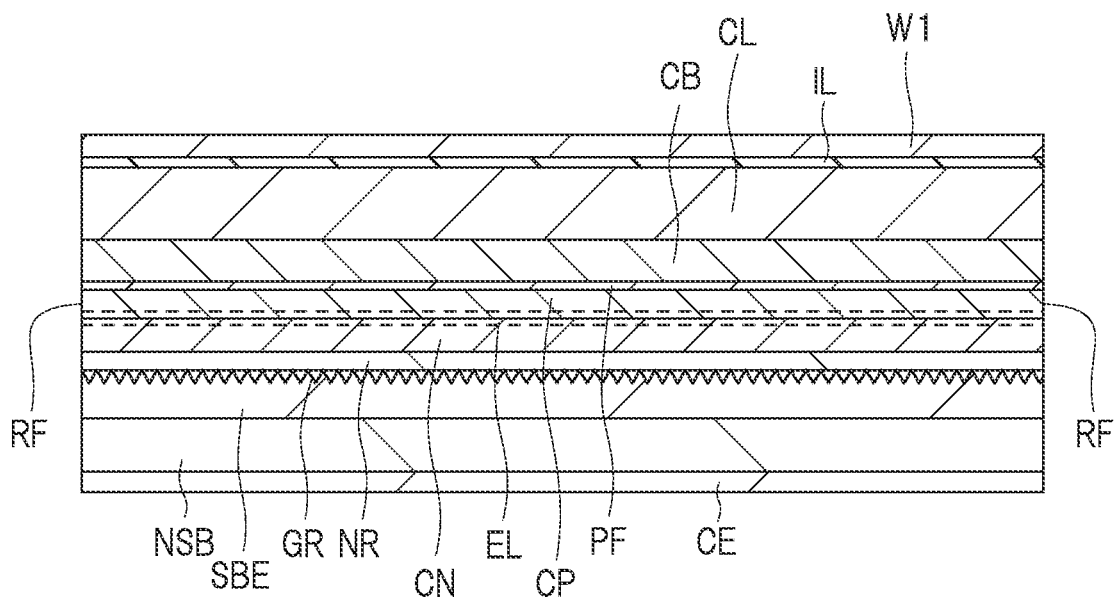
FIG. 15 is a cross-sectional view taken along a line B-B of FIG. 13.

A semiconductor device according to the present modification example will be described with reference to FIG. 11 to FIG. 15. FIG. 11 is a plan view illustrating a semiconductor chip, which is a semiconductor device according to the present modification example, and a wiring on a substrate. FIG. 12 is a cross-sectional view including the semiconductor chip, which is the semiconductor device according to the present modification example, and the wiring on the substrate. FIG. 13 is a plan view illustrating the semiconductor chip that is the semiconductor device according to the present modification example. FIG. 14 is a cross-sectional view taken along a line A-A of FIG. 13. FIG. 15 is a cross-sectional view taken along a line B-B of FIG. 13.

As illustrated in FIG. 11 to FIG. 15, configurations of a semiconductor chip CHP2, a transmission substrate SB1 on which the semiconductor chip CHP2 is mounted, and the like are similar to the structure that has been described with reference to FIG. 5 to FIG. 9. In this regard, the semiconductor device according to the present modification example is different from the structure that has been described with reference to FIG. 5 to FIG. 9 in that a cathode electrode is formed on a back surface of the semiconductor chip CHP2.

Namely, as illustrated in FIG. 14, a cathode electrode CE is formed on a back surface of a semiconductor substrate NSB constituting the semiconductor chip CHP2. Further, the semiconductor substrate NSB is a high-concentration N-type semiconductor substrate that has a lower resistance than that of the semiconductor substrate SB illustrated in FIG. 8. Further, a semiconductor region SBE having a lower conductivity than that of the semiconductor substrate NSB is formed in the semiconductor substrate NSB over a predetermined depth from a main surface of the semiconductor substrate NSB. The semiconductor region SBE is formed so as to continuously cover a region located directly under each of a first laminated film F1, a semiconductor element LD1, and a semiconductor element LD2, which are arranged in an X direction. However, the semiconductor region SBE is not formed in a region opposite to the semiconductor element LD1, that is, a region located directly under the second laminated film F2 of a region adjacent to the semiconductor element LD2 in the X direction, and the main surface of the high-concentration semiconductor substrate NSB and a semiconductor region NR are in contact with each other. Further, a wiring W3 (see FIG. 8) is not formed on the second laminated film F2.

Here, the semiconductor region NR electrically connected to a cathode of the semiconductor element LD2 is electrically connected to a wiring WL1B (see FIG. 11) via the cathode electrode CE. In a case where a current flows into the semiconductor elements LD1 and LD2 according to the present modification example, a current flowing through the semiconductor element LD2 and into the semiconductor region NR flows into the semiconductor substrate NSB from a region under which the semiconductor region SBE having a high resistance is not provided (that is, under the second laminated film F2), and then flows into the wiring WL1B via the cathode electrode CE.

Here, since the entire back surface of the semiconductor substrate NSB is covered with the cathode electrode CE, a bonding wire BW is connected to only a wiring W1, which is an anode electrode, in order for the bonding wire BW to be installed on one of two differential signal wirings (here, the wiring WL1B) for conduction. As a result, it is possible to reduce the number of bonding wires whose impedance control is difficult to only one, and this makes it possible to simplify the design thereof. Further, by reducing the number of bonding wires, it is possible to reduce parasitic inductance of the bonding wire by half. In addition, by reducing the number of bonding wires, it is also possible to reduce impedance variation.

Second Embodiment

In a case where a plurality of semiconductor elements is formed on one semiconductor chip, it is necessary that all of the semiconductor elements are non-defective products. On the other hand, in the present embodiment, two semiconductor elements are respectively formed on separate semiconductor chips, and the semiconductor chips are arranged side by side and connected in series.

Figure 16:
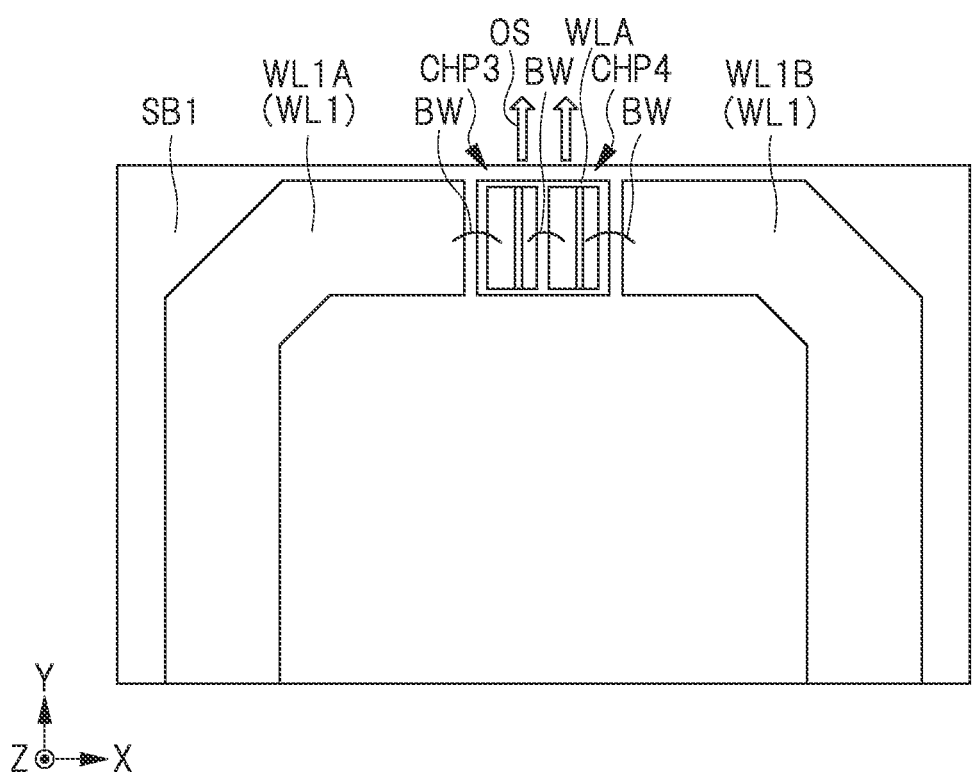
FIG. 16 is a plan view including a semiconductor chip and a wiring on a substrate according to a second embodiment.
Figure 17:
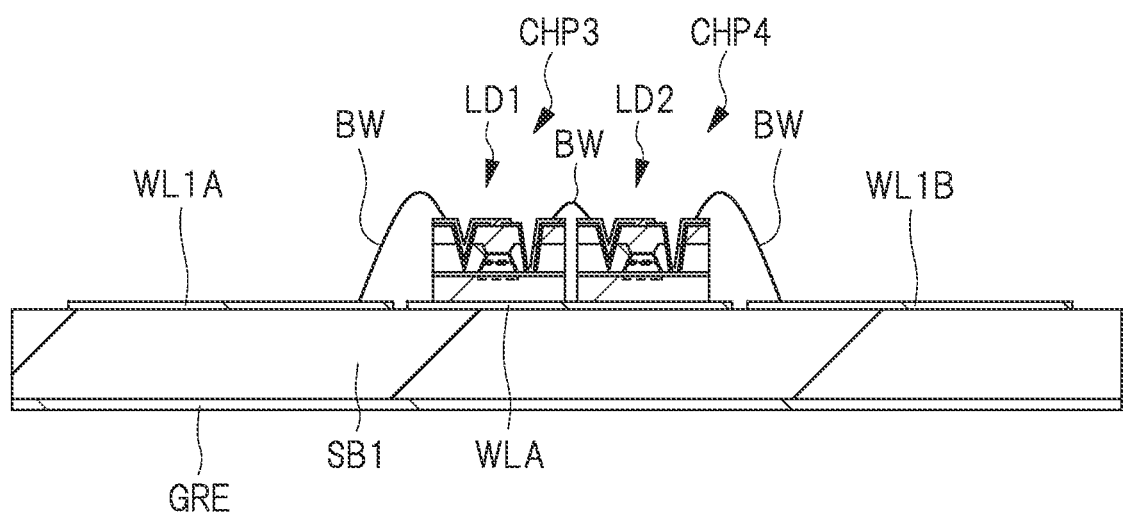
FIG. 17 is a cross-sectional view including the semiconductor chip and the wiring on the substrate according to the second embodiment.
Figure 18:
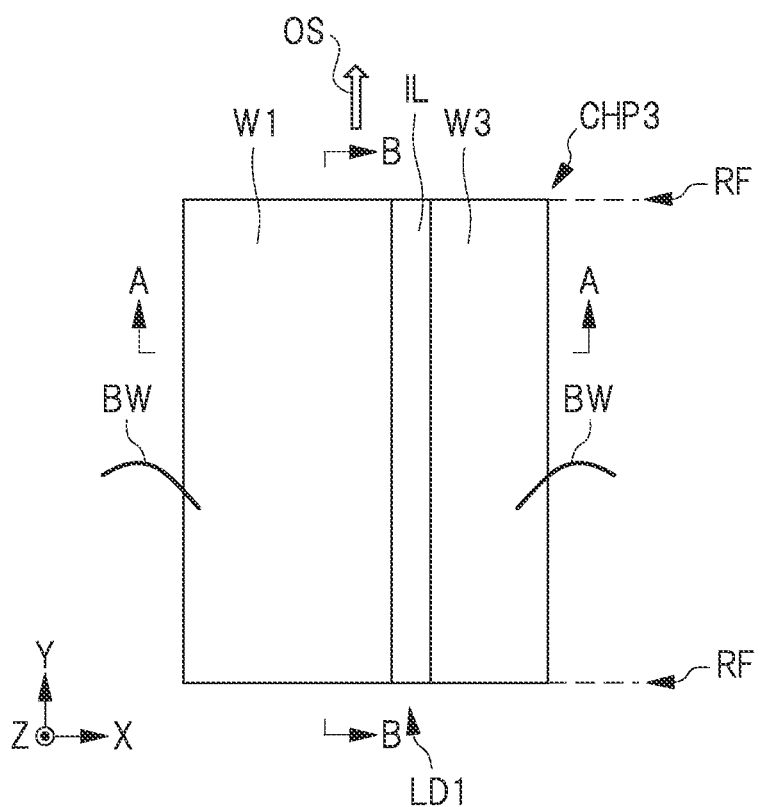
FIG. 18 is a plan view illustrating the semiconductor chip according to the second embodiment.
Figure 19:
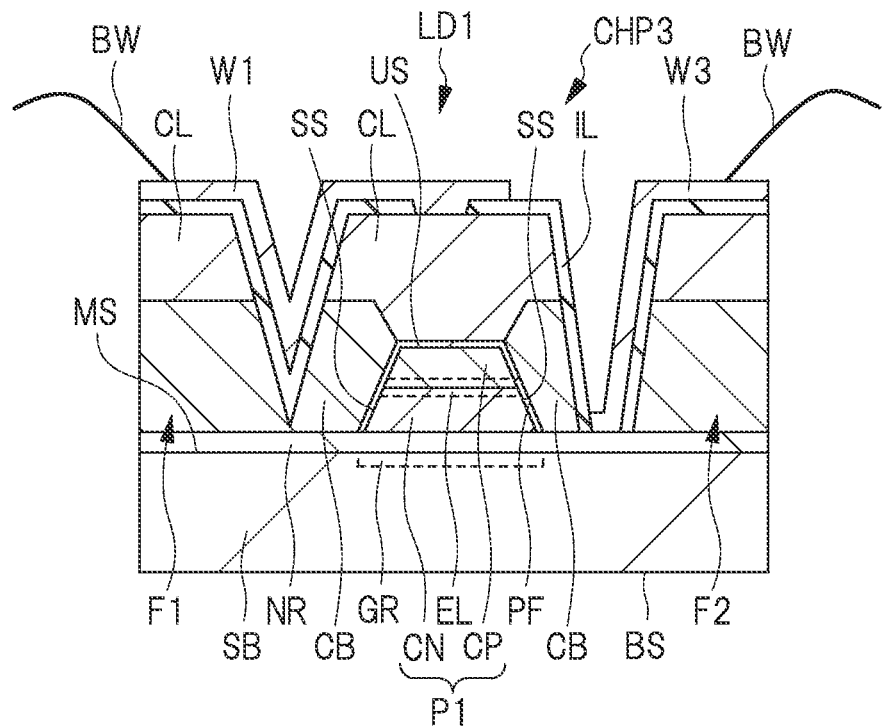
FIG. 19 is a cross-sectional view taken along a line A-A of FIG. 18.
Figure 20:
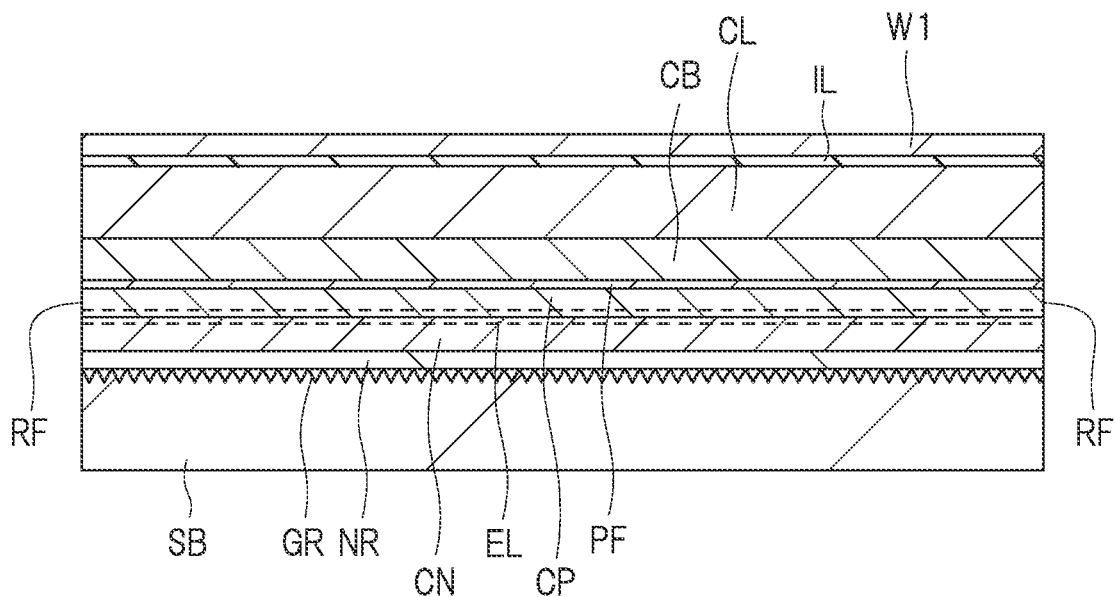
FIG. 20 is a cross-sectional view taken along a line B-B of FIG. 18.

A semiconductor device according to the present embodiment will be described with reference to FIG. 16 to FIG. 20. FIG. 16 is a plan view including a semiconductor chip, which is the semiconductor device according to the present embodiment, and a wiring on a substrate. FIG. 17 is a cross-sectional view including the semiconductor chip, which is the semiconductor device according to the present embodiment, and the wiring on the substrate. FIG. 18 is a plan view illustrating the semiconductor chip that is the semiconductor device according to the present embodiment. FIG. 19 is a cross-sectional view taken along a line A-A of FIG. 18. FIG. 20 is a cross-sectional view taken along a line B-B of FIG. 18.

Here, as illustrated in FIG. 16 and FIG. 17, a semiconductor chip CHP3 provided with a semiconductor element LD1 and a semiconductor chip CHP4 provided with a semiconductor element LD2 are connected to each other in series. The semiconductor chips CHP3 and CHP4 are arranged on one wiring WLA side by side in an X direction. Since each of the semiconductor chips CHP3 and CHP4 has the same structure, the structure of the semiconductor chip CHP3 will be described below.

As illustrated in FIG. 18 to FIG. 20, the semiconductor chip CHP3 includes a first laminated film F1 and a second laminated film F2, and one semiconductor element LD1 is provided between the first laminated film F1 and the second laminated film F2. In other words, the semiconductor chip CHP3 is different from the semiconductor chip CHP1 (see FIG. 8) in that the number of mounted semiconductor element is only one. A bonding wire BW connected to a wiring W3, which is a cathode electrode of the semiconductor chip CHP3, is connected to a wiring W1, which is an anode electrode of the semiconductor chip CHP4 (see FIG. 17). In other words, an anode of the semiconductor element LD2 is electrically connected to a cathode of the semiconductor element LD1 via a semiconductor region NR and the bonding wire BW. As a result, the two semiconductor elements LD1 and LD2 are connected to each other in series via the bonding wire BW that is a metallic wiring.

In the present embodiment, two separate semiconductor chips are mounted on a transmission substrate. For this reason, it is possible to collect only non-defective semiconductor chips to construct a semiconductor device. This makes it possible to improve reliability of the semiconductor device. In addition, it is possible to reduce a manufacturing cost of the semiconductor device.

First Modification Example

In a case where two semiconductor elements are formed on separate semiconductor chips, a cathode electrode may be formed on a back surface of a semiconductor substrate.

Figure 21:
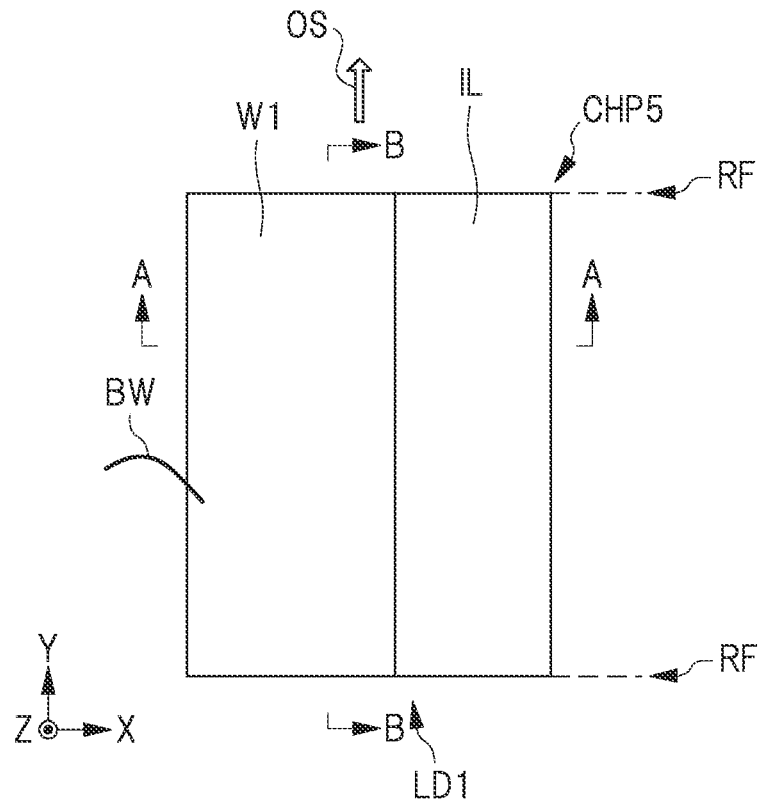
FIG. 21 is a plan view illustrating a semiconductor chip according to a first modification example of the second embodiment.
Figure 22:
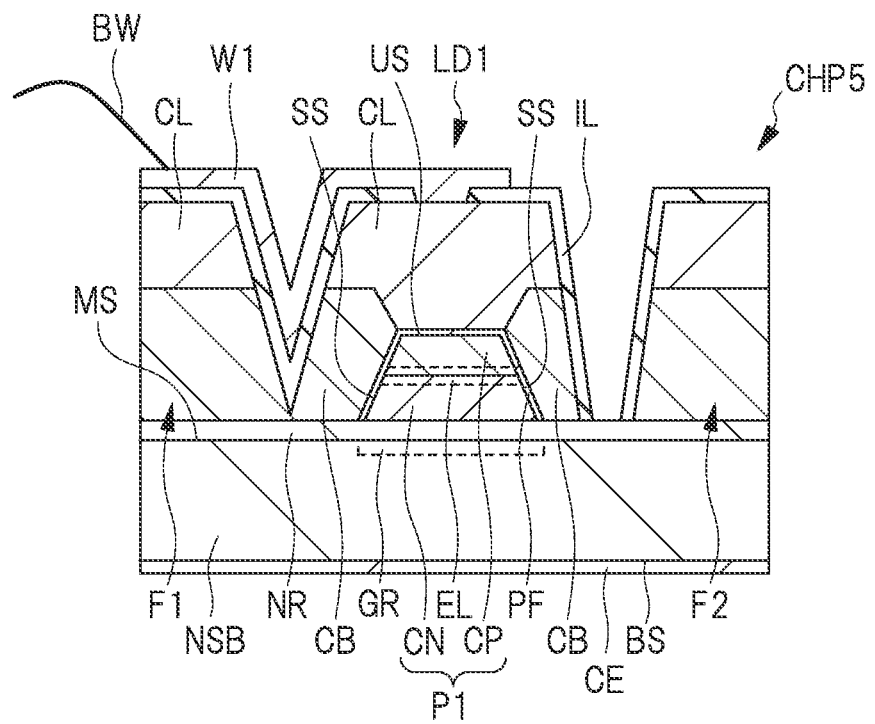
FIG. 22 is a cross-sectional view taken along a line A-A of FIG. 21.
Figure 23:
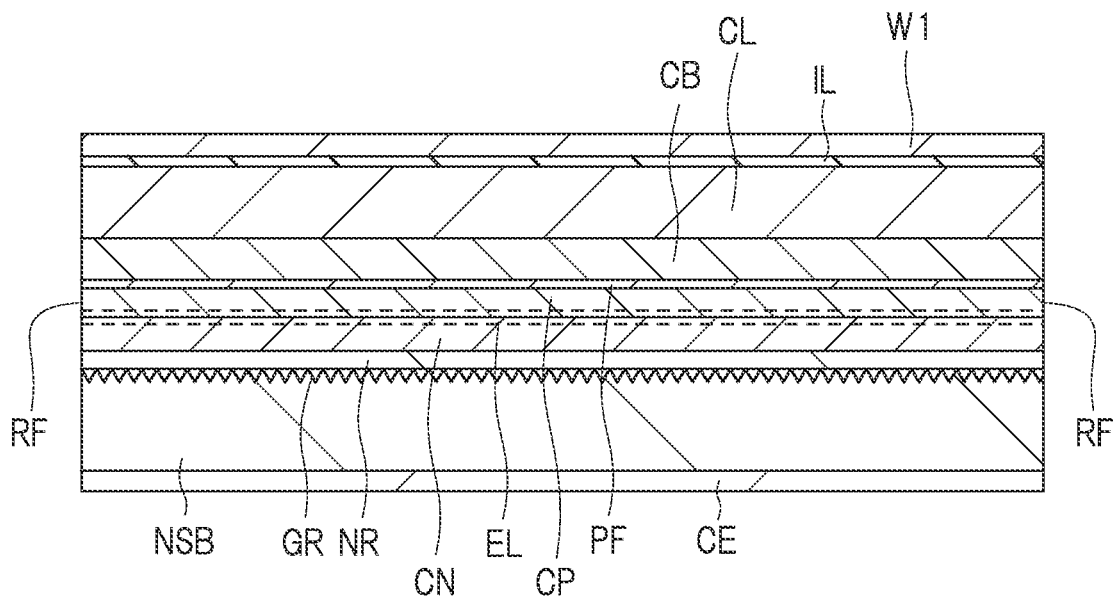
FIG. 23 is a cross-sectional view taken along a line B-B of FIG. 21.
Figure 24:
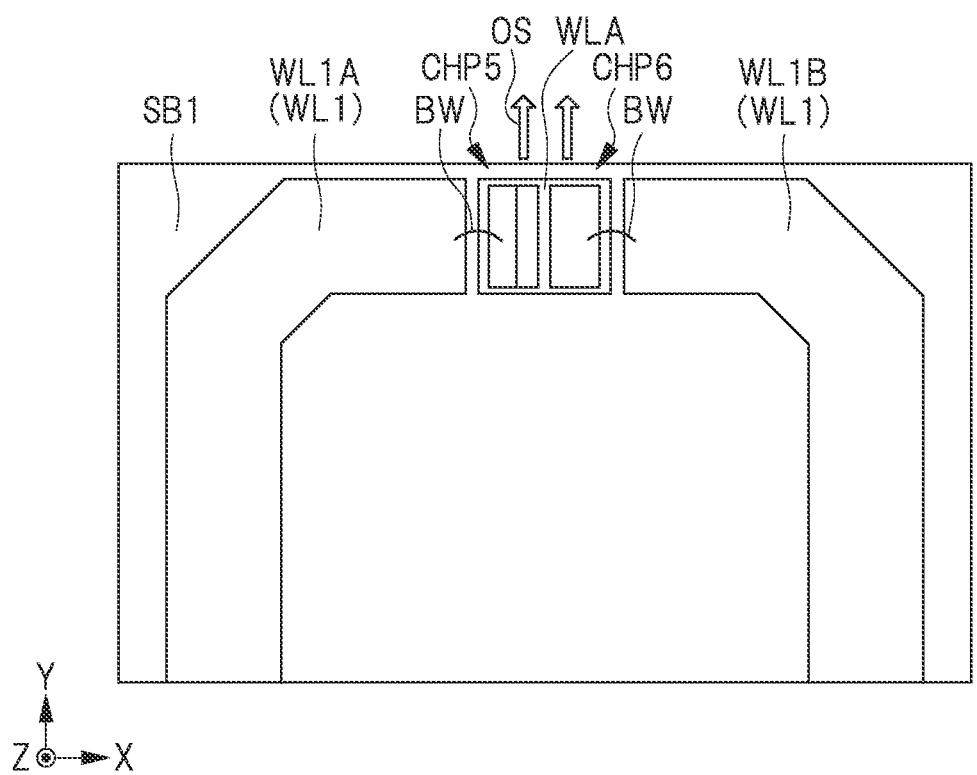
FIG. 24 is a plan view including a semiconductor chip and a wiring on a substrate according to the first modification example of the second embodiment.
Figure 25:
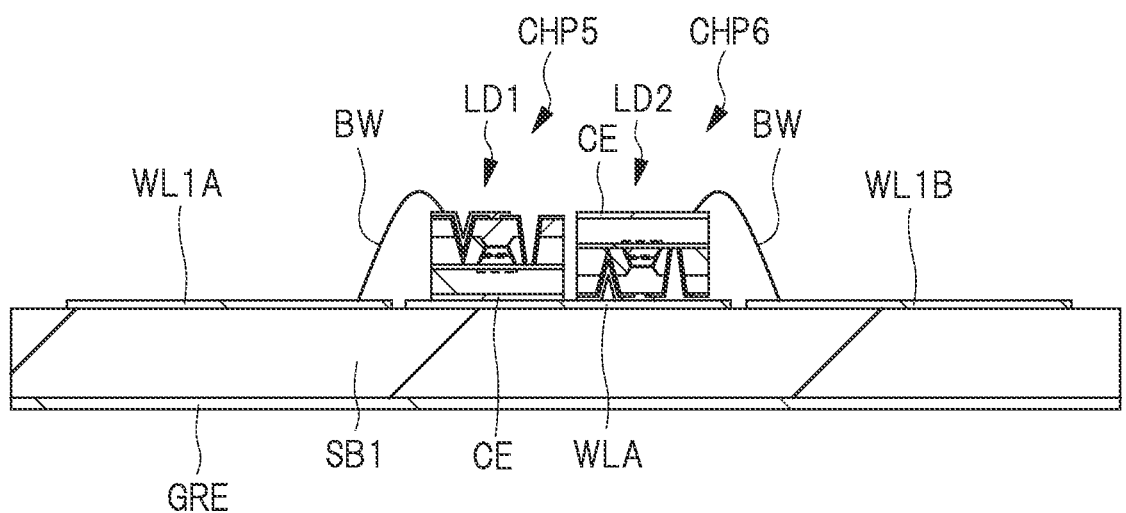
FIG. 25 is a cross-sectional view including the semiconductor chip and the wiring on the substrate according to the first modification example of the second embodiment.

A semiconductor device according to the present modification example will be described with reference to FIG. 21 to FIG. 25. FIG. 21 is a plan view illustrating a semiconductor chip that is a semiconductor device according to the present modification example. FIG. 22 is a cross-sectional view taken along a line A-A of FIG. 21. FIG. 23 is a cross-sectional view taken along a line B-B of FIG. 21. FIG. 24 is a plan view including a semiconductor chip, which is the semiconductor device according to the present modification example, and a wiring on a substrate. FIG. 25 is a cross-sectional view including the semiconductor chip, which is the semiconductor device according to the present modification example, and the wiring on the substrate.

A structure of each of semiconductor chips CHP5 and CHP6 is the same as each other. Thus, hereinafter, the structure of the semiconductor chip CHP5 will be described.

As illustrated in FIG. 21 to FIG. 23, the structure of the semiconductor chip CHP5 is different from the semiconductor chip CHP3 illustrated in FIG. 19 in that a lower surface of a semiconductor substrate SB is covered with a cathode electrode CE and a high-concentration the semiconductor substrate NSB having enhanced conductivity is used as the substrate.

Here, as illustrated in FIG. 24 and FIG. 25, the semiconductor chip CHP5 provided with a semiconductor element LD1 and the semiconductor chip CHP6 provided with a semiconductor element LD2 are connected to each other in series. The semiconductor chips CHP5 and CHP6 are arranged on one wiring WLA side by side in an X direction. A cathode electrode CE is formed on a back surface of each of the semiconductor chips CHP5 and CHP6. A lower surface of the cathode electrode CE at the back surface side of the semiconductor chip CHP5 is connected to an upper surface of the wiring WLA. On the other hand, the semiconductor chip CHP6 is turned upside down, and an upper surface of a wiring W1, which is an anode electrode of the semiconductor chip CHP6, is connected to the upper surface of the wiring WLA. In other words, in the semiconductor chip CHP5, a semiconductor layer CP constituting the semiconductor chip CHP5 is disposed so as to be located on the semiconductor layer CN. On the other hand, in the semiconductor chip CHP6, a semiconductor layer CP constituting the semiconductor chip CHP6 is disposed so as to be located under the semiconductor layer CN. In other words, the semiconductor chip CHP6 is disposed so that an upper surface US of the semiconductor element LD2 faces the upper surface side of the wiring WLA. For this reason, the semiconductor elements LD1 and LD2 are connected to each other in series via the wiring WLA that is a metallic wiring. A semiconductor region NR electrically connected to a cathode of the semiconductor element LD2 is electrically connected to a wiring WL1B via the cathode electrode CE of the semiconductor chip CHP6 and a bonding wire BW.

In the present modification example, since the two semiconductor elements are respectively provided in the separate semiconductor chips, the similar effect of the semiconductor device, which has been described with reference to FIG. 16 to FIG. 20, can be obtained.

Second Modification Example

Figure 26:
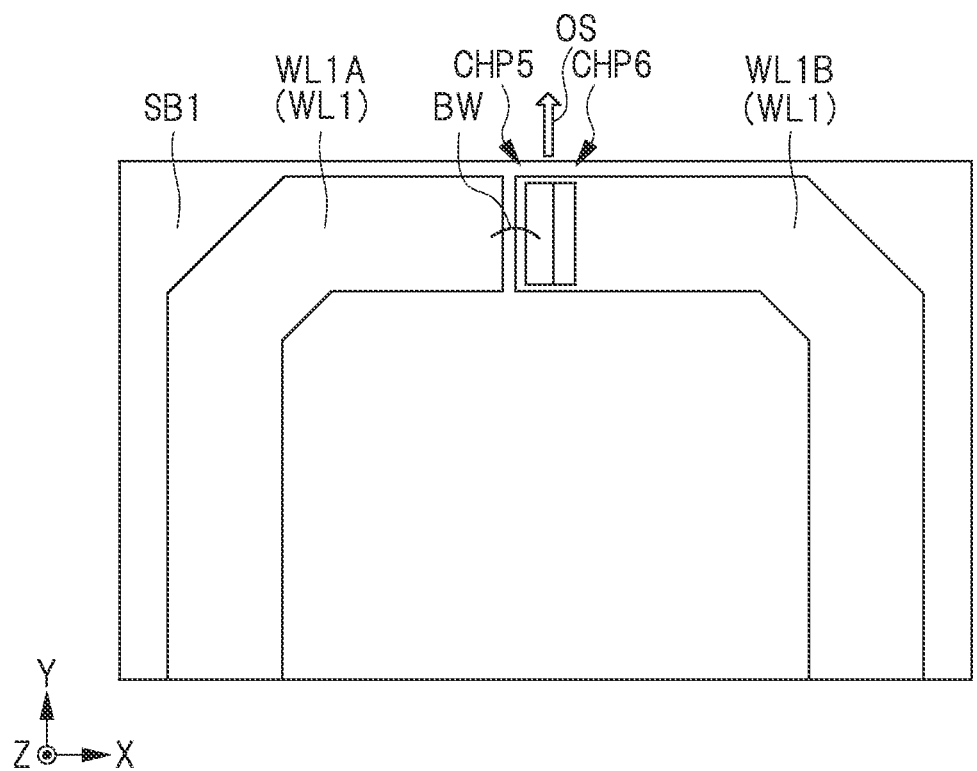
FIG. 26 is a plan view including semiconductor chip and wiring on a substrate according to a second modification example of the second embodiment.
Figure 27:
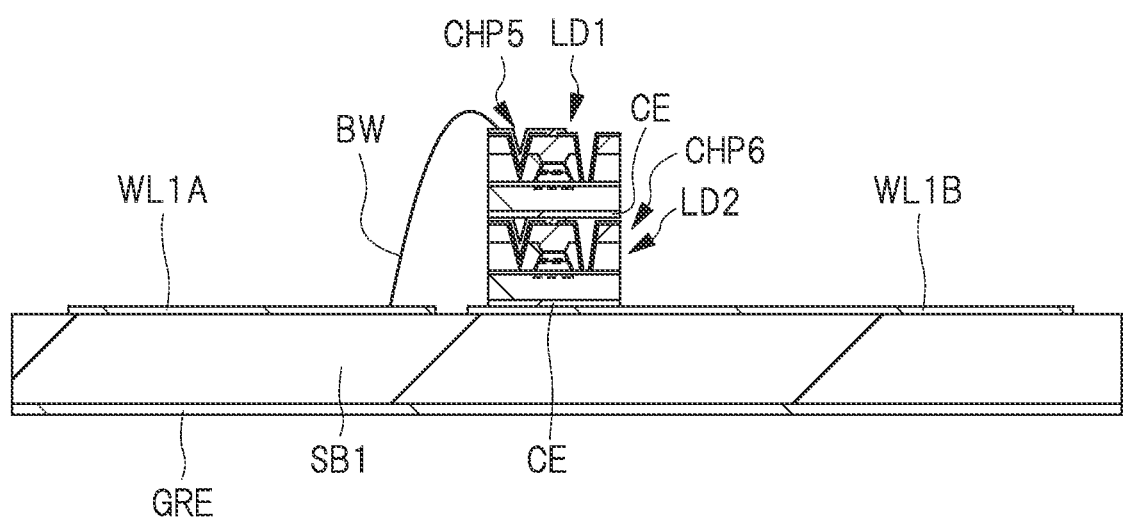
FIG. 27 is a cross-sectional view including the semiconductor chip and the wiring on the substrate according to the second modification example of the second embodiment.

As illustrated in FIG. 26 and FIG. 27, the semiconductor chips CHP5 and CHP6 that have been explained in the first modification example may be connected to each other in series. FIG. 26 is a plan view including a semiconductor chip, which is a semiconductor device according to the present modification example, and a wiring on a substrate. FIG. 27 is a cross-sectional view including the semiconductor chip, which is the semiconductor device according to the present modification example, and the wiring on the substrate.

Here, a semiconductor chip CHP6 is mounted a wiring WL1B, a semiconductor chip CHP5 is disposed on the semiconductor chip CHP6, and a lower surface of the semiconductor chip CHP5 is connected to an upper surface of the semiconductor chip CHP6. An anode electrode of the semiconductor chip CHP5 is electrically connected to a wiring WL1A via a bonding wire BW. A cathode electrode CE provided on a back surface of the semiconductor chip CHP5 is electrically connected to a wiring W1 that is an anode electrode provided on an upper portion of the semiconductor chip CHP6. In other words, a lower surface of the cathode electrode CE provided on the back surface of the semiconductor chip CHP5 is connected to an upper surface of the wiring W1 on the semiconductor chip CHP6. A cathode electrode CE of the semiconductor chip CHP6 is electrically connected to the wiring WL1B. Thus, a semiconductor element LD1 of the semiconductor chip CHP5 and a semiconductor element LD2 of the semiconductor chip CHP6 are connected to each other in series via the cathode electrode CE of the semiconductor chip CHP5, which is a metallic wiring, and the wiring W1 (see FIG. 22), which is the anode electrode of the semiconductor chip CHP6.

In the present modification example, since the two semiconductor elements are provided in the separate semiconductor chips, the similar effect of the semiconductor device, which has been described with reference to FIG. 16 to FIG. 20, can be obtained. Further, since the number of bonding wires whose impedance control is difficult can be reduced to only one, the design thereof becomes easy. In addition, by reducing the number of bonding wires, it is also possible to reduce impedance variation.

Third Embodiment

Figure 28:
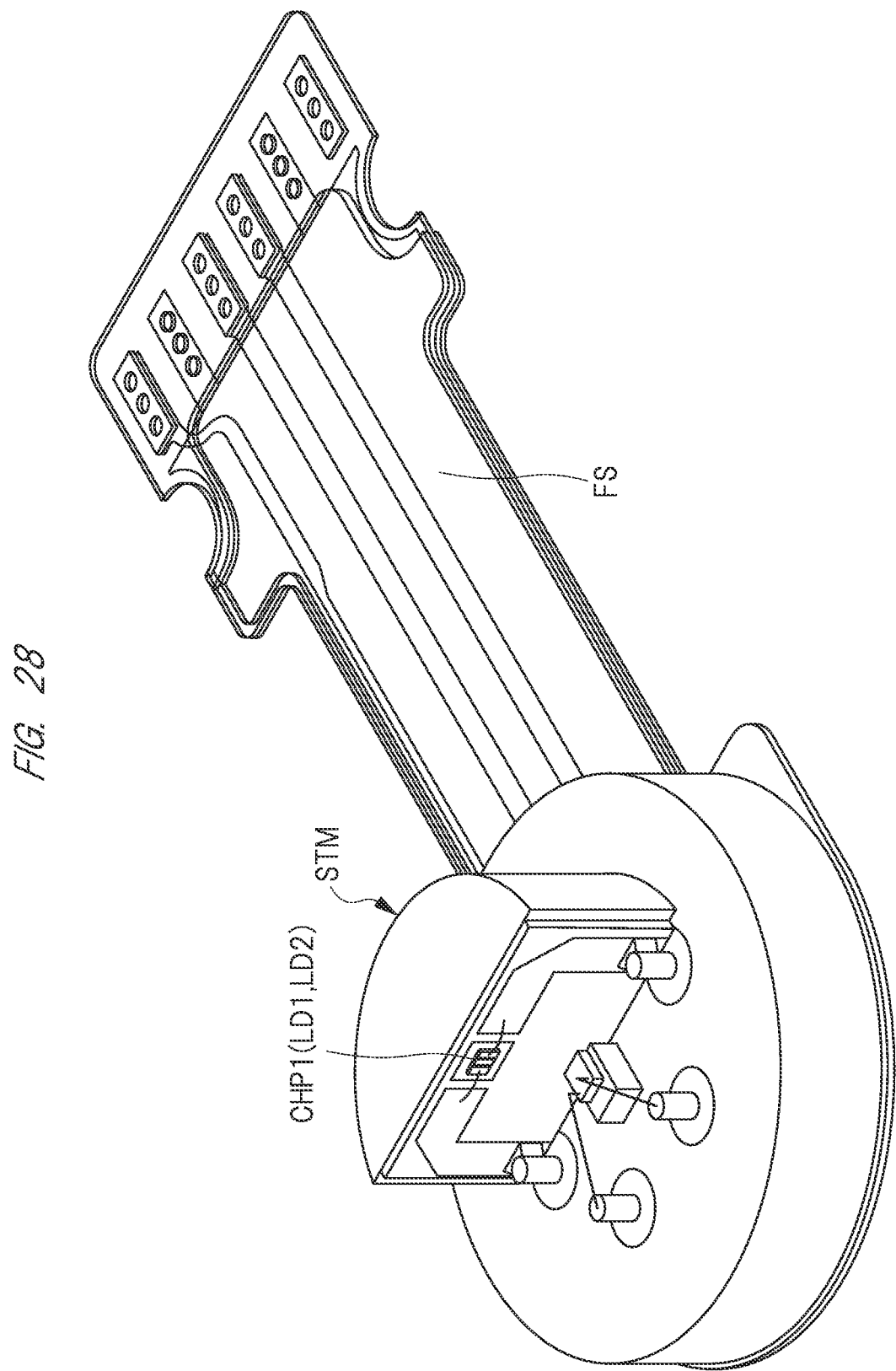
FIG. 28 is a perspective view schematically illustrating a stem and a flexible substrate that constitute a part of an electronic device according to a third embodiment.

FIG. 28 is a perspective view schematically illustrating a stem STM and a flexible substrate FS that constitute a part of a semiconductor device SA1. In FIG. 28, the stem STM and the flexible substrate FS are parts in the semiconductor device SA1, which correspond to a path through which a high-frequency signal (that is, a high-speed signal) propagates. A semiconductor chip CHP1, which semiconductor elements LD1 and LD2 are formed, is mounted on the stem STM, and a DC/RF signal line is formed on the flexible substrate FS.

Figure 29:
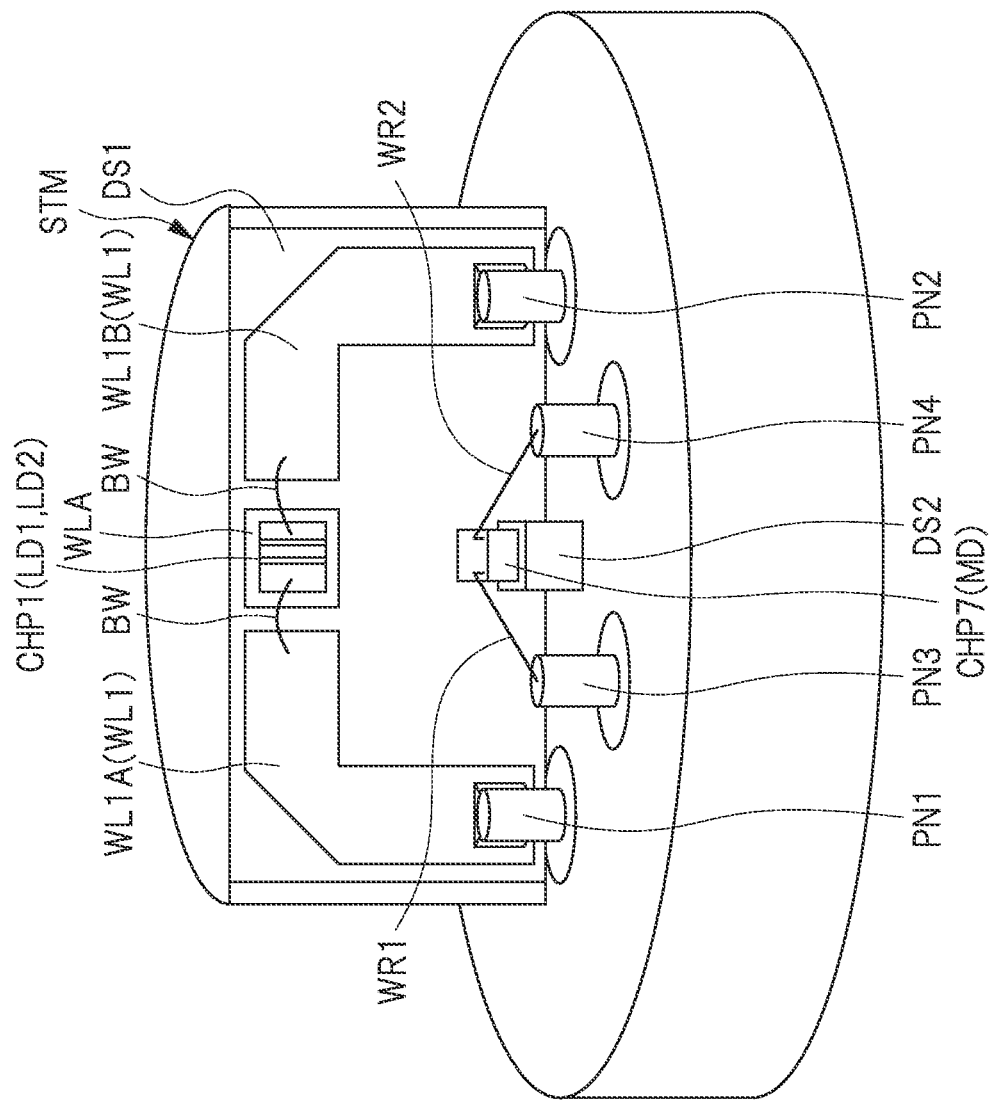
FIG. 29 is a view illustrating a detailed configuration of the stem constituting the electronic device according to the third embodiment.

Next, FIG. 29 is a view illustrating a detailed configuration of the stem STM. A dielectric substrate DS1 made of aluminum nitride (AlN), for example, is arranged on the stem STM. A wiring WL1A, a wiring WL1B, and a wiring WLA located between the wiring WL1A and wirings WL1B are formed on a surface of this dielectric substrate DS1. Further, the semiconductor chip CHP1 having the semiconductor elements LD1 and LD2 is mounted on the wiring WLA. Further, the wiring WL1A and the semiconductor chip CHP1 are connected to each other via the bonding wire BW, and the wiring WL1A is connected to a pin PN1 for injecting a DC/RF signal. On the other hand, the wiring WL1B and the semiconductor chip CHP1 are connected to each other via the bonding wire BW, and the wiring WL1B is connected to a pin PN2 for injecting a DC/RF signal.

Further, as illustrated in FIG. 29, the stem STM includes a semiconductor chip CHP7 in which a photodiode for monitor MD for feedback control of light outputted from the semiconductor elements LD1 and LD2 is formed. This semiconductor chip CHP7 is mounted on a dielectric substrate DS2. Further, As illustrated in FIG. 29, the semiconductor chip CHP7 in which the photodiode for monitor MD is formed is connected to a pin for monitor PN3 via a wire WR2, and is connected to a pin for monitor PN4 via a wire WR3.

Although the dielectric substrate DS1 and the dielectric substrate DS2 are made of, for example, aluminum nitride, materials of the dielectric substrate DS1 and the dielectric substrate DS2 can be selected from the viewpoint of a heat sink and the design of characteristic impedance. For this reason, for example, a dielectric material having a thermal conductivity of 100 W/(m·K) or more at room temperature can also be used for the dielectric substrate DS1 or the dielectric substrate DS2. Further, the wiring WL1A and the wiring WL1B can be composed of a microstrip line. For example, characteristic impedance (single end) of each of the wiring WL1A and the wiring WL1B is 25Ω, and characteristic impedance (differential impedance) of each of the wiring WL1A and the wiring WL1B is 50Ω.

Figure 30:
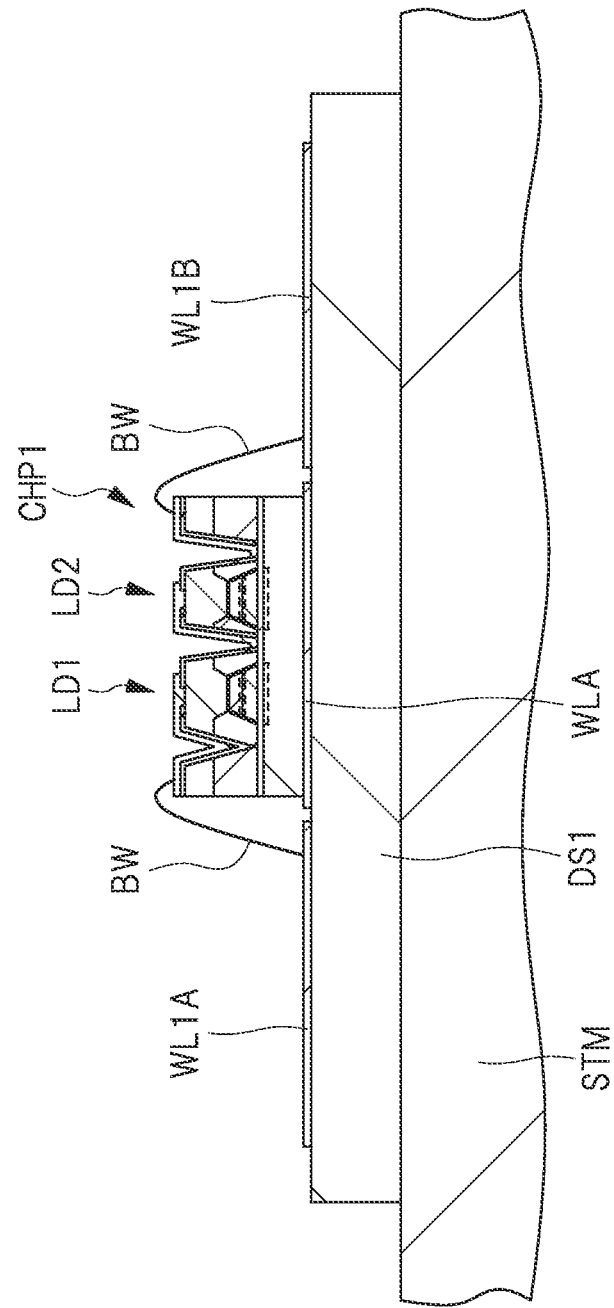
FIG. 30 is a cross-sectional view schematically illustrating a semiconductor chip mounted on a dielectric substrate, which composes the electronic device according to the third embodiment.

Subsequently, FIG. 30 is a cross-sectional view schematically illustrating a semiconductor chip and a chip resistance mounted on a dielectric substrate. As illustrated in FIG. 30, the wiring WL1A and the wiring WL1B are formed on the dielectric substrate DS1 arranged on the stem STM. The respective wiring WL1A and WL1B are electrically connected to the semiconductor chip CHP1 via the bonding wires BW.

FIG. 31 is a view illustrating a schematic mounting configuration of a transmission unit 1a of an optical transceiver that is an electronic device according to the present embodiment. As illustrated in FIG. 31, the transmission unit 1a includes a mounting substrate PCB on which a transmission line TL1 is formed, and a semiconductor device SA2 in which a driving circuit DRV is embedded is mounted on this mounting substrate PCB. In this case, as illustrated in FIG. 31, the semiconductor device SA2 in which the driving circuit DRV is embedded is electrically connected to the transmission line TL1 formed on the mounting substrate PCB. Moreover, the transmission line TL1 formed on the mounting substrate PCB is electrically connected to the flexible substrate FS on which the semiconductor device SA1 including the semiconductor elements LD1 and LD2 is mounted. As a result, the semiconductor device SA1 in which the semiconductor elements LD1 and LD2 are embedded is electrically connected to the semiconductor device SA2 in which the driving circuit DRV is embedded via the transmission line TL1.

As described above, the semiconductor chip provided with the two semiconductor elements, which has been described in the first embodiment, can be attached to the dielectric substrate formed on the stem and be used. Here, a driving circuit for driving each of the semiconductor elements is provided in the semiconductor device mounted on the mounting substrate, which is coupled to the dielectric substrate via the flexible substrate. By mounting the semiconductor chip on such an electronic device, it is possible to improve performance of the optical transceiver, and it is also possible to improve performance of the electronic device.

As described above, the invention made by the inventors of the present application has been described specifically on the basis of the embodiments. However, the present invention is not limited to the first to third embodiments described above, and it goes without saying that the present invention may be modified into various forms without departing from the substance thereof.

For example, in the first and second embodiments, the case where the semiconductor element as the laser diode is composed of the N-type semiconductor layer and the P-type semiconductor layer formed on the N-type semiconductor layer has been described. However, the positions of the N-type semiconductor layer and the P-type semiconductor layer may be reversed.

What is claimed is:

1. A semiconductor device comprising:
a semiconductor chip having a semiconductor substrate, a first semiconductor element formed on the semiconductor substrate, and a second semiconductor element formed on the semiconductor substrate;
a first wiring electrically connected to an anode of the first semiconductor element; and
a second wiring electrically connected to a cathode of the second semiconductor element,
wherein each of the first semiconductor element and the second semiconductor element includes:
a laminated pattern formed on the semiconductor substrate, the laminated pattern including a first end surface, a second end surface opposite the first end surface, a first side surface located between the first end surface and the second end surface, a second side surface located between the first end surface and the second end surface and opposite to the first side surface, and an upper surface;

a first semiconductor layer covering the first side surface of the laminated pattern;

a second semiconductor layer covering the second side surface of the laminated pattern; and a third semiconductor layer covering the upper surface of the laminated pattern, wherein the laminated pattern of each of the first semiconductor element and the second semiconductor element includes:

a fourth semiconductor layer of a first conductive type formed on the semiconductor substrate;

a fifth semiconductor layer of a second conductive type formed on the fourth semiconductor layer, the second conductive type being opposite to the first conductive type; and an emission layer formed at a boundary surface between the fourth semiconductor layer and the fifth semiconductor layer, wherein an index of refraction of each of the first semiconductor layer, the second semiconductor layer and the third semiconductor layer is smaller than an index of refraction of each of the fourth semiconductor layer and the fifth semiconductor layer, and wherein the first semiconductor element and the second semiconductor element are connected to each other in series between the first wiring and the second wiring.

2. The semiconductor device according to claim 1, wherein the semiconductor chip further includes:

a semiconductor region formed between the semiconductor substrate and each of the first semiconductor element and the second semiconductor element;

a third wiring formed on the third semiconductor layer of the first semiconductor element via a first insulating layer; and a fourth wiring formed on the third semiconductor layer of the second semiconductor element via a second insulating layer so as to be in contact with the semiconductor region, and wherein an anode of the second semiconductor element is electrically connected to a cathode of the first semiconductor element via the semiconductor region and the fourth wiring.

3. The semiconductor device according to claim 2, wherein the third wiring electrically connected to the anode of the first semiconductor element is electrically connected to the first wiring via a first bonding wire, and wherein the semiconductor region electrically connected to the cathode of the second semiconductor element is electrically connected to the second wiring via a second bonding wire.

4. The semiconductor device according to claim 3, wherein the laminated pattern is covered with each of the first semiconductor layer, the second semiconductor layer, and the third semiconductor layer via a passivation film.

5. The semiconductor device according to claim 3, wherein irregularities are formed in a region of the semiconductor substrate located directly under the laminated pattern so as to be in contact with the semiconductor region.

6. The semiconductor device according to claim 2, wherein the semiconductor substrate includes:

a main surface on which the laminated pattern of the first semiconductor element and the laminated pattern of the second semiconductor element are formed;

a back surface opposite to the main surface; and a cathode electrode formed on the back surface, wherein the third wiring electrically connected to the anode of the first semiconductor element is electrically connected to the first wiring via a first bonding wire, and wherein the semiconductor region electrically connected to the cathode of the second semiconductor element is electrically connected to the second wiring via the cathode electrode.

7. The semiconductor device according to claim 6, wherein the laminated pattern is covered with each of the first semiconductor layer, the second semiconductor layer, and the third semiconductor layer via a passivation film.

8. The semiconductor device according to claim 6, wherein irregularities are formed in a region of the semiconductor substrate located directly under the laminated pattern so as to be in contact with the semiconductor region.

9. A semiconductor device comprising:

a first semiconductor chip having a first semiconductor substrate and a first semiconductor element formed on the first semiconductor substrate;

a second semiconductor chip having a second semiconductor substrate and a second semiconductor element formed on the second semiconductor substrate;

a first wiring electrically connected to an anode of the first semiconductor element; and a second wiring electrically connected to a cathode of the second semiconductor element, wherein the first semiconductor element includes:

a first laminated pattern formed on the first semiconductor substrate, the first laminated pattern including a first end surface, a second end surface opposite the first end surface, a first side surface located between the first end surface and the second end surface, a second side surface located between the first end surface and the second end surface and opposite to the first side surface, and a first upper surface;

a first semiconductor layer covering the first side surface of the first laminated pattern;

a second semiconductor layer covering the second side surface of the first laminated pattern; and a third semiconductor layer covering the first upper surface of the first laminated pattern, wherein the second semiconductor element includes:

a second laminated pattern formed on the second semiconductor substrate, the second laminated pattern including a third end surface, a fourth end surface opposite the third end surface, a third side surface located between the third end surface and the fourth end surface, a fourth side surface located between the third end surface and the fourth end surface and opposite to the third side surface, and a third upper surface;

a fourth semiconductor layer covering the third side surface of the second laminated pattern;

a fifth semiconductor layer covering the fourth side surface of the second laminated pattern; and a sixth semiconductor layer covering the first upper surface of the second laminated pattern,
wherein the first laminated pattern includes:
a seventh semiconductor layer of a first conductive type formed on the first semiconductor substrate;
an eighth semiconductor layer of a second conductive type formed on the seventh semiconductor layer, the second conductive type being opposite to the first conductive type; and
a first emission layer formed at a boundary surface between the seventh semiconductor layer and the eighth semiconductor layer,
wherein the second laminated pattern includes:
a ninth semiconductor layer of the first conductive type formed on the second semiconductor substrate;
a tenth semiconductor layer of the second conductive type formed on the ninth semiconductor layer; and
a second emission layer formed at a boundary surface between the ninth semiconductor layer and the tenth semiconductor layer,
wherein an index of refraction of each of the first semiconductor layer, the second semiconductor layer and the third semiconductor layer is smaller than an index of refraction of each of the seventh semiconductor layer and the eighth semiconductor layer,
wherein an index of refraction of each of the fourth semiconductor layer, the fifth semiconductor layer and the sixth semiconductor layer is smaller than an index of refraction of each of the ninth semiconductor layer and the tenth semiconductor layer, and
wherein the first semiconductor element and the second semiconductor element are connected to each other in series between the first wiring and the second wiring.

10. The semiconductor device according to claim 9,
wherein the first semiconductor chip further includes:
a first semiconductor region formed between the first semiconductor substrate and the first semiconductor element;
a third wiring formed on a first portion of the third semiconductor layer of the first semiconductor element via a first insulating layer; and
a fourth wiring formed on a second portion of the third semiconductor layer of the first semiconductor element via a second insulating layer so as to be in contact with the first semiconductor region,
wherein the second semiconductor chip further includes:
a second semiconductor region formed between the second semiconductor substrate and the second semiconductor element;
a fifth wiring formed on a first portion of the sixth semiconductor layer of the second semiconductor element via a third insulating layer; and
a sixth wiring formed on a second portion of the sixth semiconductor layer of the second semiconductor element via a fourth insulating layer so as to be in contact with the second semiconductor region, and
wherein an anode of the second semiconductor element is electrically connected to a cathode of the first semiconductor element via the first semiconductor region and a seventh wiring.

11. The semiconductor device according to claim 10,
wherein the third wiring electrically connected to the anode of the first semiconductor element is electrically connected to the first wiring via a first bonding wire, and
wherein the second semiconductor region electrically connected to the cathode of the second semiconductor element is electrically connected to the second wiring via a second bonding wire.

12. The semiconductor device according to claim 11,
wherein the first laminated pattern is covered with each of the first semiconductor layer, the second semiconductor layer, and the third semiconductor layer via a first passivation film, and
wherein the second laminated pattern is covered with each of the fourth semiconductor layer, the fifth semiconductor layer, and the sixth semiconductor layer via a second passivation film.

13. The semiconductor device according to claim 11,
wherein irregularities are formed in a region of the first semiconductor substrate located directly under the first laminated pattern so as to be in contact with the first semiconductor region, and
wherein irregularities are formed in a region of the second semiconductor substrate located directly under the second laminated pattern so as to be in contact with the second semiconductor region.

14. The semiconductor device according to claim 10,
wherein the first semiconductor chip and the second semiconductor chip are arranged side by side, and
wherein the seventh wiring is a third bonding wire.

15. The semiconductor device according to claim 10,
wherein the first semiconductor substrate includes:
a first main surface on which the first laminated pattern is formed;
a first back surface opposite to the first main surface; and
a first cathode electrode formed on the first back surface,
wherein the second semiconductor substrate includes:
a second main surface on which the second laminated pattern is formed;
a second back surface opposite to the second main surface; and
a second cathode electrode formed on the second back surface,
wherein the first semiconductor chip and the second semiconductor chip are arranged on the seventh wiring side by side,
wherein the second semiconductor chip is arranged so that an upper surface of the second semiconductor element faces an upper surface of the seventh wiring,
wherein the third wiring electrically connected to the anode of the first semiconductor element is electrically connected to the first wiring via a first bonding wire,
wherein a lower surface of the first cathode electrode is connected to the upper surface of the seventh wiring,
wherein an upper surface of the fifth wiring is connected to the upper surface of the seventh wiring, and
wherein the second semiconductor region electrically connected to the cathode of the second semiconductor element is electrically connected to the second wiring via the second cathode electrode and a second bonding wire.

16. The semiconductor device according to claim 10,
wherein the first semiconductor substrate includes:
a first main surface on which the first laminated pattern is formed;
a first back surface opposite to the first main surface; and
a first cathode electrode formed on the first back surface, the first cathode electrode being the seventh wiring, wherein the second semiconductor substrate includes:
- a second main surface on which the second laminated pattern is formed;
- a second back surface opposite to the second main surface; and
- a second cathode electrode formed on the second back surface, wherein the first semiconductor chip is arranged on the second semiconductor chip, wherein the third wiring electrically connected to the anode of the first semiconductor element is electrically connected to the first wiring via a first bonding wire, wherein a lower surface of the first cathode electrode is connected to an upper surface of the fifth wiring, and wherein the second semiconductor region electrically connected to the cathode of the second semiconductor element is electrically connected to the second wiring via the second cathode electrode.

17. An electronic device comprising:
a stem;
a dielectric substrate formed on the stem, the dielectric substrate having a first wiring and a second wiring arranged along the first wiring;
a first semiconductor chip mounted on the dielectric substrate, the first semiconductor chip having a semiconductor substrate, a first semiconductor element formed on the semiconductor substrate, and a second semiconductor element formed on the semiconductor substrate, an anode of the first semiconductor element being electrically connected to the first wiring, and a cathode of the second semiconductor element being electrically connected to the second wiring;
a mounting substrate coupled to the dielectric substrate via a flexible substrate; and
a second semiconductor chip mounted on the mounting substrate,
wherein each of the first semiconductor element and the second semiconductor element includes:
- a laminated pattern formed on the semiconductor substrate, the laminated pattern including a first end surface, a second end surface opposite the first end surface, a first side surface located between the first end surface and the second end surface, a second side surface located between the first end surface and the second end surface and opposite to the first side surface, and an upper surface;
- a first semiconductor layer covering the first side surface of the laminated pattern;
- a second semiconductor layer covering the second side surface of the laminated pattern; and
- a third semiconductor layer covering the upper surface of the laminated pattern, wherein the laminated pattern of each of the first semiconductor element and the second semiconductor element includes:
- a fourth semiconductor layer of a first conductive type formed on the semiconductor substrate;
- a fifth semiconductor layer of a second conductive type formed on the fourth semiconductor layer, the second conductive type being opposite to the first conductive type; and
- an emission layer formed at a boundary surface between the fourth semiconductor layer and the fifth semiconductor layer, wherein an index of refraction of each of the first semiconductor layer, the second semiconductor layer and the third semiconductor layer is smaller than an index of refraction of each of the fourth semiconductor layer and the fifth semiconductor layer, wherein the first semiconductor element and the second semiconductor element are connected to each other in series between the first wiring and the second wiring, and wherein a driving circuit configured to drive the first semiconductor element and the second semiconductor element is provided in the second semiconductor chip.

* * * * *